(12) United States Patent
Koduri

(10) Patent No.: US 11,264,336 B2
(45) Date of Patent: Mar. 1, 2022

(54) PACKAGED DEVICE CARRIER FOR THERMAL ENHANCEMENT OR SIGNAL REDISTRIBUTION OF PACKAGED SEMICONDUCTOR DEVICES

(71) Applicant: Texas Instruments Incorporated, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 16/680,044

(22) Filed: Nov. 11, 2019

(65) Prior Publication Data
US 2021/0143106 A1 May 13, 2021

(51) Int. Cl.
| | |
|---|---|
| *H01L 23/00* | (2006.01) |
| *H01L 23/31* | (2006.01) |
| *H01L 23/495* | (2006.01) |
| *H01L 21/48* | (2006.01) |
| *H01L 23/14* | (2006.01) |
| *H01L 23/498* | (2006.01) |

(52) U.S. Cl.
CPC ........ *H01L 23/562* (2013.01); *H01L 21/4825* (2013.01); *H01L 23/145* (2013.01); *H01L 23/3114* (2013.01); *H01L 23/4952* (2013.01); *H01L 23/49562* (2013.01); *H01L 23/49568* (2013.01); *H01L 23/49575* (2013.01); *H01L 23/49582* (2013.01); *H01L 23/49838* (2013.01); *H01L 23/49861* (2013.01)

(58) Field of Classification Search
None
See application file for complete search history.

(56) References Cited

U.S. PATENT DOCUMENTS

| | | | | |
|---|---|---|---|---|
| 6,559,525 | B2* | 5/2003 | Huang | H01L 23/4334 257/675 |
| 7,019,389 | B2* | 3/2006 | Lai | H01L 23/3107 257/666 |
| 2004/0100772 | A1* | 5/2004 | Chye | H01L 24/97 361/702 |
| 2009/0045503 | A1* | 2/2009 | Koduri | H01L 23/4334 257/693 |
| 2010/0091472 | A1* | 4/2010 | Kummerl | H01L 23/49541 361/772 |

\* cited by examiner

*Primary Examiner* — Andres Munoz
(74) *Attorney, Agent, or Firm* — Dawn Jos; Charles A. Brill; Frank D. Cimino

(57) ABSTRACT

In a described example, an apparatus includes a packaged device carrier having a board side surface and an opposing surface, the packaged device carrier having conductive leads having a first thickness spaced from one another; the conductive leads having a head portion attached to a dielectric portion, a middle portion extending from the head portion and extending away from the board side surface of the packaged device carrier at an angle to the opposing surface, and each lead having an end extending from the middle portion with a foot portion configured for mounting to a substrate.

18 Claims, 26 Drawing Sheets

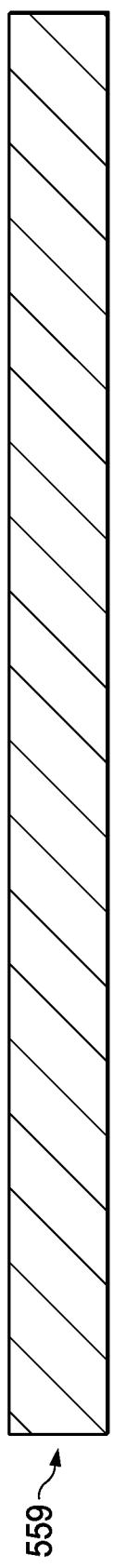
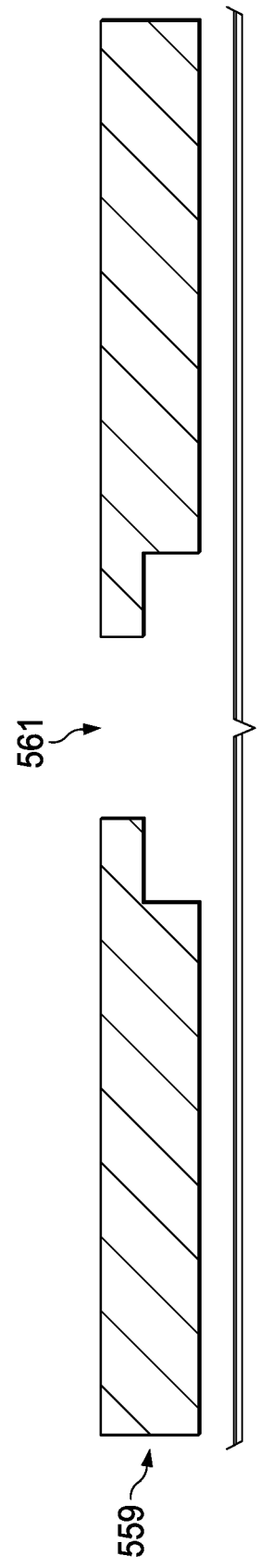

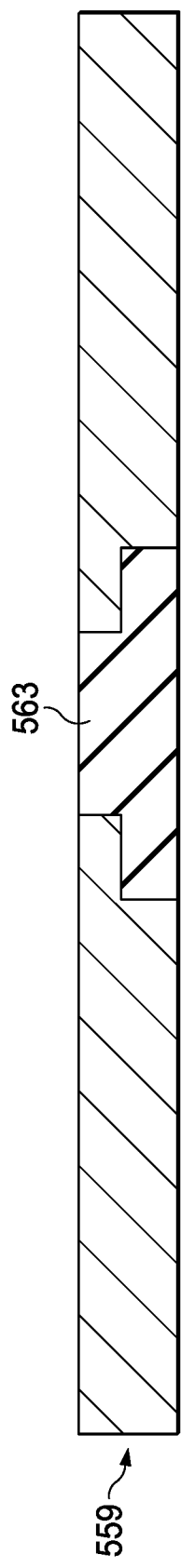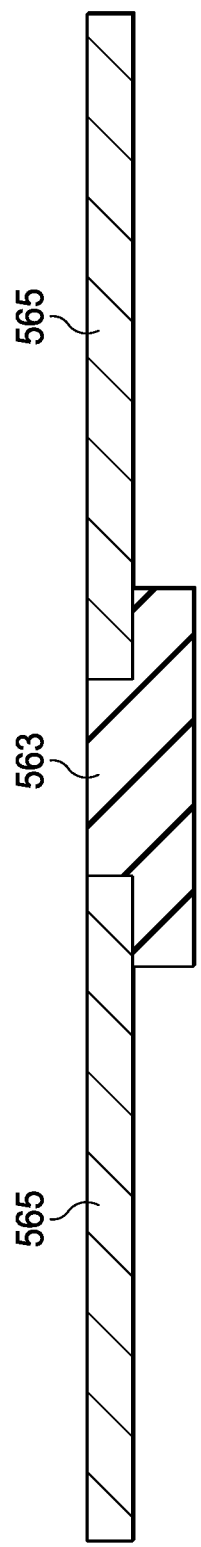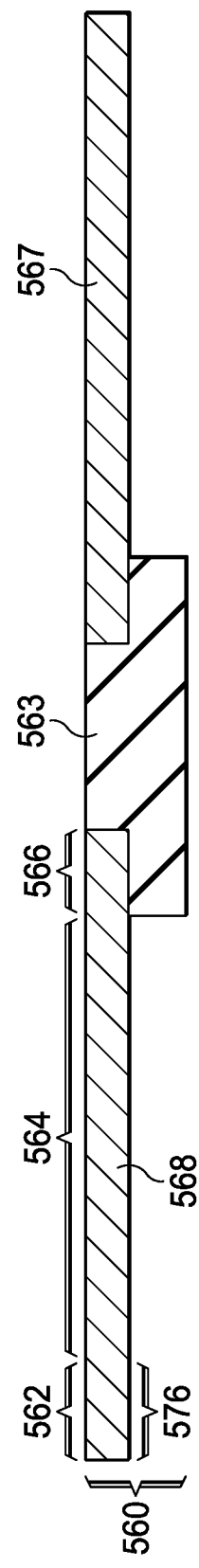

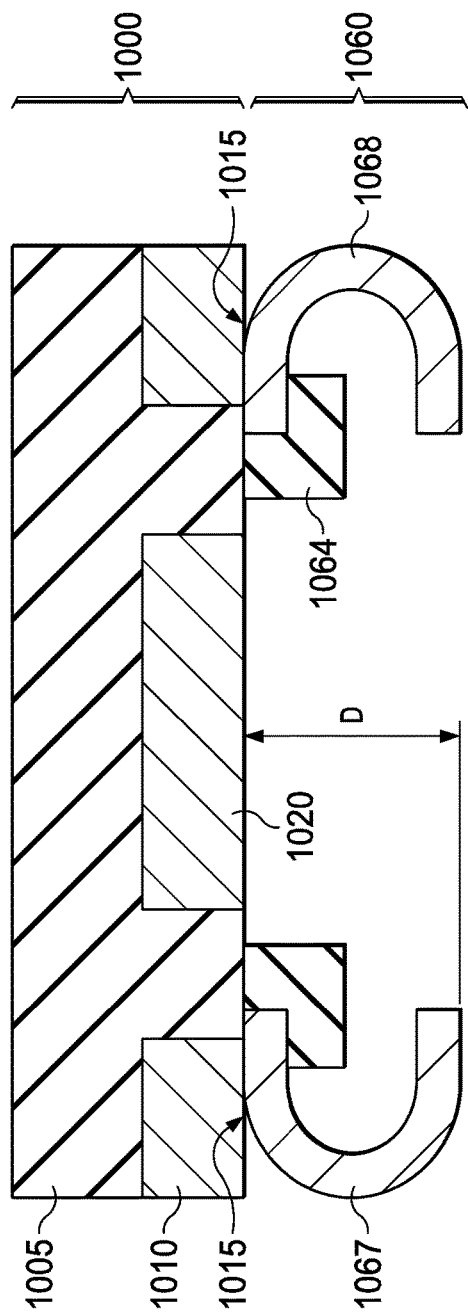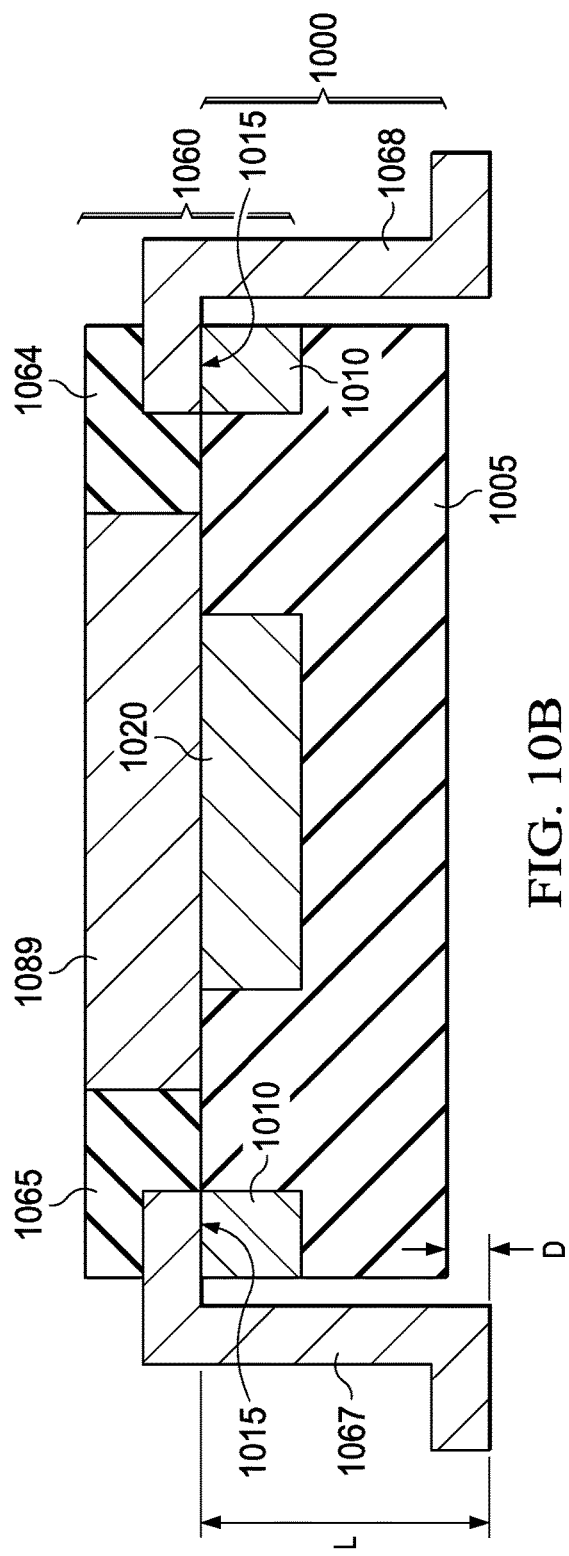

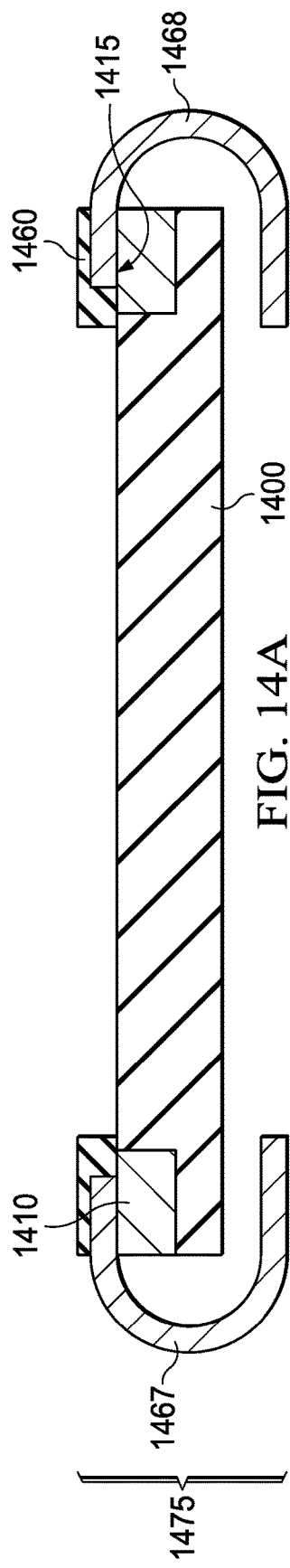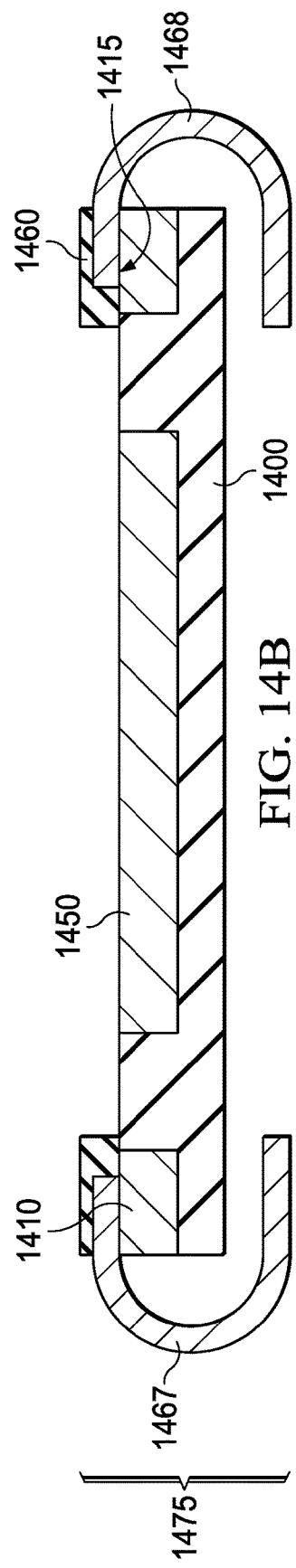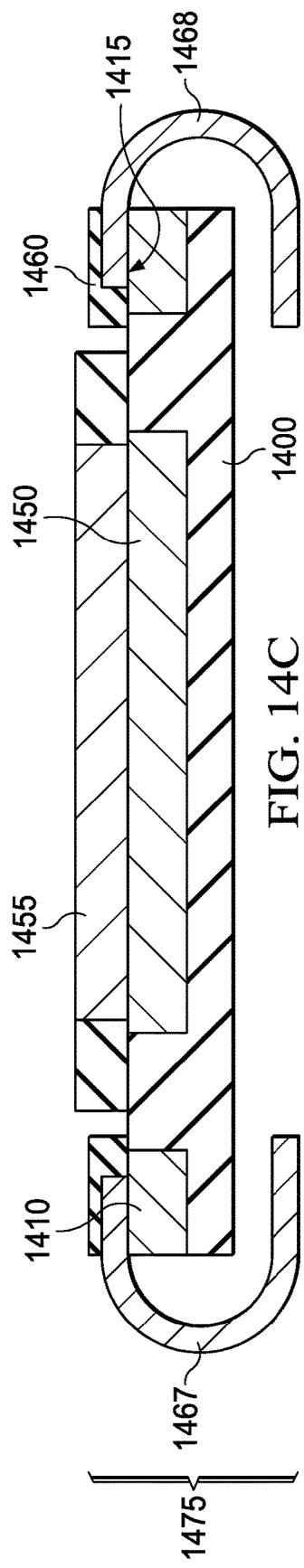

PACKAGED DEVICE CARRIER FOR THERMAL ENHANCEMENT OR SIGNAL REDISTRIBUTION OF PACKAGED SEMICONDUCTOR DEVICES

TECHNICAL FIELD

This disclosure relates generally to packaged semiconductor devices, and more particularly to semiconductor devices packaged in no-lead packages to be mounted on a board or substrate.

BACKGROUND

Semiconductor devices continue to increase the current carrying and power capability of circuits implemented in the semiconductor devices. Semiconductor technologies specifically directed to power applications such as gallium nitride (GaN) field effect transistor (FET) and other power semiconductor technologies produce circuits capable of carrying hundreds of amps and of transferring power in the kilowatt range. To carry power and current at these levels, increased thermal energy dissipation is needed.

Semiconductor devices are provided in packages with electrical terminals for making external connections. Increasingly "no-lead" packages are used. These packages provide small footprint and reduced need for board area, and are conveniently arranged for surface mounting technology (SMT) to mount to a board such as a printed circuit board. The packaged semiconductor devices can be mounted to other types of substrates as well as printed circuit boards. The no-lead packages include one form where terminals are provided on four sides, referred to as a quad flat no-lead (QFN) package, and in another form a small outline package where package terminals are formed on one or two sides, the small outline no-lead (SON) package. In both cases the external boundary of the terminals is contained in the same plane as the exterior of the molded package body, hence the term "no-lead" is used to refer these packages.

In certain applications, the use of the no-lead package poses difficulties in meeting board level reliability (BLR) requirements for the finished system or board. The use of surface mount technology for no-lead packages means the solder connections between the package and the board are located beneath the packaged semiconductor device, and thus the solder joints are not available for visual or machine vision inspection. A surface mounted no-lead package has a solder joint between two rigid surfaces, a terminal that is the end of a conductive lead on the packaged device, and a conductive land on the printed circuit board or substrate. There is no flexibility in this solder connection so that field use reliability can be impacted, as the solder joint between the packaged device terminal and the board can fail under mechanical stress or thermo-mechanical stress. Further, some no-lead packages are arranged so that a thermal pad that is part of the no-lead package and is arranged to conduct heat from the semiconductor device is placed on a corresponding thermal land on the circuit board. The circuit board then is supposed to provide a thermal dissipation path for the thermal energy produced by the semiconductor device. However, a printed circuit board can easily become thermally saturated by other devices mounted on the board, so that the board does not have the capacity to efficiently carry the thermal energy away from the semiconductor device, and in a worst case scenario, the thermal land on the printed circuit board may in fact conduct thermal energy from other devices mounted to the board into the packaged semiconductor device, adding heat to the packaged device instead of dissipating the thermal energy. Semiconductor device performance typically degrades with increased temperature so that overall performance is reduced when thermal energy is not dissipated away from the packaged devices.

SUMMARY

In a described example, an apparatus includes a packaged device carrier having a board side surface and an opposing surface, the packaged device carrier having conductive leads having a first thickness spaced from one another; the conductive leads having a head portion attached to a dielectric portion, a middle portion extending from the head portion and extending away from the board side surface of the packaged device carrier at an angle to the opposing surface, and each lead having an end extending from the middle portion with a foot portion configured for mounting to a substrate.

BRIEF DESCRIPTION OF THE DRAWINGS

FIGS. 5A-5E illustrate in another series of cross-sectional views the major steps for forming a packaged device carrier of an arrangement.

FIG. 10A illustrates in a cross sectional view an example arrangement for a packaged device carrier with a packaged semiconductor device, FIG. 10B is a cross-sectional view of an additional arrangement for a packaged device carrier.

FIGS. 14A-14C illustrate in cross-sectional views example packaged device carriers with different packaged semiconductor devices mounted thereon.

FIG. 15C illustrates the packaged semiconductor device mounted to the packaged device carrier in a projection view, while

DETAILED DESCRIPTION

Figure 1:
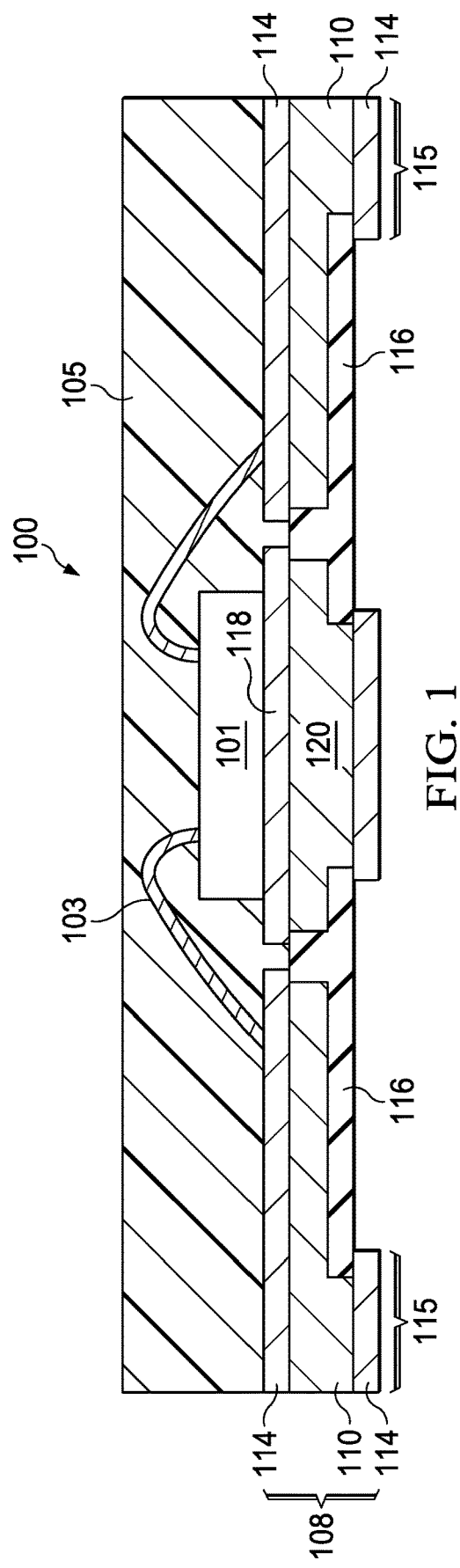
FIG. 1 is a cross sectional view of a packaged semiconductor device.

Corresponding numerals and symbols in the different figures generally refer to corresponding parts unless otherwise indicated. The figures are not necessarily drawn to scale.

In this description, the term "semiconductor device" is used. A semiconductor device is a device formed on a semiconductor substrate. Semiconductor substrates that are used including silicon, gallium, gallium arsenide, gallium nitride, germanium, and indium, for example. Semiconductor devices include integrated circuits where several, hundreds or even thousands of individual devices such as transistors are formed on a semiconductor substrate, and the transistors are then coupled to one another using conductors formed over an active surface of the semiconductor substrate to form a complete circuit function. Integrated circuits can include processors, analog-to-digital converters, memories and other integrated devices. The term semiconductor device also includes discrete devices formed on semiconductor substrates such as discrete transistors, power field-effect-transistors (FETs), switching power converters, relays, diodes, opto-couplers, microwave circuits, and other device including active devices and passive devices such as silicon controlled rectifiers (SCRs), resistors, capacitors, transformers, inductors and transducers.

In this description, the term "semiconductor device die" is used. As used herein, a semiconductor device die is a single semiconductor device initially formed along with many other semiconductor devices on a semiconductor wafer, and then separated from the semiconductor wafer by a dicing process referred to as "singulation."

In this description the term "substrate" is used. As used herein, the term "substrate" includes a molded interconnect substrate (MIS), laminate, plastic, ceramic, film or tape based substrates, printed circuit boards (PCBs) including fiber reinforced glass substrates such as FR4, BT resin substrates, metal lead frames of conductive metal (including copper, stainless steel, Alloy 42), and premolded leadframes (PMLFs) that include metal leads and mold compound formed together in a substrate. Further the term "substrate" includes another semiconductor device die or a portion of a semiconductor wafer so that in the arrangements, semiconductor device dies can be stacked for additional integration in a packaged device.

In this description, the term "terminal" is used. A terminal is a conductive area for making electrical connection to a semiconductor device die. Semiconductor device die terminals can include aluminum, copper or other conductive metals forming bond pads. Solder bumps, copper bumps, copper pillars and copper pillar bumps can be formed on the bond pads as part of the terminals. The bumps of the electrical terminals can include additional platings such as nickel, palladium, tin, gold, solder and combinations such as ENIG (electroless nickel immersion gold) and ENEPIG (electroless nickel, electroless palladium, immersion gold) and combinations to promote solderability, increase adhesion, and to reduce or prevent corrosion or oxidation of metals, such as copper or aluminum. Packaged device terminals include conductive leads that have portions exposed from the exterior surfaces of the packaged device, such as leads extending from a package (in a "leaded package" or leads that are coextensive with the exterior of the package (in a "leadless" or "no-lead" package.) The term "electrical terminal" includes all of these arrangements for making electrical connections to a semiconductor device die or to a packaged device.

In this description, the term "conductive land" is used. A conductive land is a conductive area for making an electrical connection to conductors. Copper lands are often used, and aluminum, gold and other conductors can be used. Copper lands may be plated with nickel, gold, tin, palladium, and combinations of these to increase solderability and bondability, increase adhesion, and reduce or prevent corrosion or oxidation.

In this description, the term "C-shaped" is used. As used herein, an element is C-shaped if, in a cross section, it has the shape of the letter "C" or its mirror image. In this description, the term "S-shaped" is used. As used herein, an element is "S-shaped" if, in a cross section, it has the shape of a letter "S" or its mirror image. In this description, the term "Z-shaped" is used. As used herein, an element is Z-shaped if, in a cross section, it has the shape of the letter "Z" or its mirror image. In the arrangements, conductive leads can have various shapes including, as examples, being C-shaped, S-shaped, and Z-shaped.

In this description, the term "flexible" is used. As used herein, an element is flexible if it capable of being bent without breaking. As used herein, a lead is a "flexible lead" if it can be moved out of an initial position a distance that is at least 5 percent of the total length of the lead. In example arrangements, the arrangements include flexible leads. Use of the flexible leads increases board level reliability in the arrangements.

In the arrangements, the problem of providing a packaged semiconductor device for mounting to a substrate is solved by providing a packaged device carrier that both carries the packaged semiconductor device and provides electrical coupling to the packaged semiconductor device and to the substrate. In some arrangements the packaged device carrier is arranged between a substrate such as a circuit board and a terminal side of the packaged semiconductor device, with the terminal side of the packaged semiconductor device facing the substrate. In alternative arrangement the packaged device carrier is arranged with the terminals of the packaged semiconductor device facing away from the substrate and mounted to a surface of the packaged device carrier that faces the substrate. The packaged device carrier includes leads coupled to the terminals of the packaged semiconductor device and extending away from a dielectric portion of the packaged device carrier, the leads shaped to carry the packaged semiconductor device spaced from the substrate to enhance thermal dissipation and device performance. In some arrangements the packaged device carrier includes one or more "sleeves" of dielectric material that carry a row of leads, the leads arranged generally in parallel to one another, the leads having conductive lands at head portions of the leads that are exposed from the dielectric material of the packaged device carrier and that are arranged to receive the terminals of the packaged device. In additional arrangements the packaged device carrier includes two or more of the sleeves each carrying leads arranged in correspondence with the terminals on the packaged device, for example corresponding to terminals on two sides of the packaged device, or corresponding to terminals on four sides of the packaged device. In additional arrangements the packaged device carrier includes a thermally conductive portion that is placed in thermal contact with a thermal pad on the packaged semiconductor device. In further alternative arrangements the packaged device carrier is arranged to allow a thermal pad on a packaged device to be exposed to an ambient atmosphere for efficient thermal transfer.

While some of the examples described illustrate using a single packaged semiconductor device on a packaged device carrier of the arrangements, in additional arrangements multiple packaged semiconductor devices can be mounted together on a packaged device carrier. A packaged power FET device can be provided and be mounted to a packaged device carrier along with another packaged device, for example with a FET gate driver circuit, or with a second packaged power FET device. Sensors or analog to digital converter ICs can be mounted to a packaged device carrier with a digital integrated circuit to form a system on a chip (SOC or SOIC) packaged device carrier.

In the arrangements, a packaged device carrier is provided with conductive leads having exposed lands at head portions that are arranged for receiving the terminals of at least one packaged semiconductor device. In an example the packaged semiconductor device can be a surface mount package such as a small outline no-lead (SON) or quad flat no-lead (QFN) package. The conductive lands of the packaged device carrier leads are arranged in a correspondence with the electrical terminals on the packaged semiconductor device. The packaged device carrier leads extend from the head portion in the dielectric and are shaped to support the packaged semiconductor device, carrying the packaged device with space between the packaged semiconductor device and the substrate (such as a printed circuit board) that the packaged device carrier is to be mounted on. The leads can take various shapes such as, for example, vertically straight leads, angled leads, C-shaped leads, S-shaped leads, or Z-shaped leads. In example arrangements the leads can be designed as "springs" or can be flexible leads arranged to move under thermal and/or mechanical stresses, and to thereby increase board level reliability (BLR) of the mounted packaged device carrier during device operations and during tests. The leads have a portion extending away from the packaged semiconductor device and are arranged for mounting to a substrate or printed circuit board using solder joints or by using other conductive material. Leads of the arrangements can have an end that includes a foot portion that is parallel to a surface of the packaged device carrier and is at an angle to a middle portion of the leads, the foot portion of the leads arranged for mounting to a board or substrate. The use of the packaged device carriers enhances thermal performance of a packaged semiconductor device by allowing increased air, ambient or other fluid contact to the packaged semiconductor device for thermal dissipation, and by thermally isolating the packaged semiconductor device from the system board.

The packaged device carrier can also have leads arranged to redistribute signals so that the interface to a printed circuit board is made more area efficient. Common signals such as power terminals on the packaged semiconductor device can be coupled to several leads of the packaged device carrier, in some arrangements these leads can be formed together as a wider single low resistance lead on the packaged device carrier to lower the path resistance, and to reduce capacitance or inductance that a number of single leads with smaller width might otherwise exhibit. The packaged device carriers of the arrangements can provide a multi-chip module by mounting two or more packaged semiconductor devices to a single packaged device carrier. The packaged device carriers of the arrangements can also incorporate passive elements such as pull up or pull down circuitry, resistors, bypass capacitors, coils or inductors, LC circuits or RC filters or other passive devices that can be coupled to and used with the packaged semiconductor devices. By placing the passives on the packaged device carrier, the total area used on the system board is reduced. The leads of the packaged device carrier can also provide mechanical stress relief to the packaged semiconductor device when compared to a surface mounted device, because the leads have the ability to move under thermal or mechanical stress that may occur in use of the packaged device. In contrast to the advantageous arrangements, a surface mounted packaged semiconductor device mounted to a printed circuit board is mechanically fixed in position.

FIG. 1 illustrates in a cross sectional view a packaged semiconductor device 100 for use with the arrangements. The example is shown in a quad flat no-lead (QFN) or small outline no lead (SON) package 100. A semiconductor device die 101 is shown mounted to a package substrate 108. Bond wires 103 couple terminals of the semiconductor device die (the terminals are not shown for clarity) to leads 110 on the package substrate 108. A thermal pad 120 is provided with a die mount area for receiving the semiconductor die and an opposing surface that is to be exposed from the package 100. A mold compound 105 covers the semiconductor device die 101, the bond wires 103, and at least a portion of the package substrate 108 The example package substrate 108 in FIG. 1 is a pre-molded leadframe (PMLF) with a pre-mold or dielectric material 116 formed in openings between the leads 110 and the thermal pad 120. Bondable plating layers 114 are provided to surfaces of the leads 110; these plating layers can include gold, nickel, palladium, tin, silver, and other materials that increase bondability of the surfaces, and which reduce corrosion by preventing copper ion migration from the leads 110, for example. The package substrate 108 can be a copper or copper alloy premolded leadframe. Other conductive materials can be used for leads 110, for example Alloy 42, or stainless steel can be used, but copper is often used for premolded leadframes.

The exposed portions of leads 110, labeled 115, form the terminals of the packaged semiconductor device 100, while the exposed portion of the thermal pad 120 provides a thermal dissipation path that is in thermal contact with the semiconductor die 101, providing a thermal transfer path to dissipate thermal energy from the semiconductor die 101. In some examples, the thermal pad 120 can also form an electrical terminal for the die 101, as a body contact of a transistor, or as a source or drain contact for a vertical process transistor.

Figure 2A:
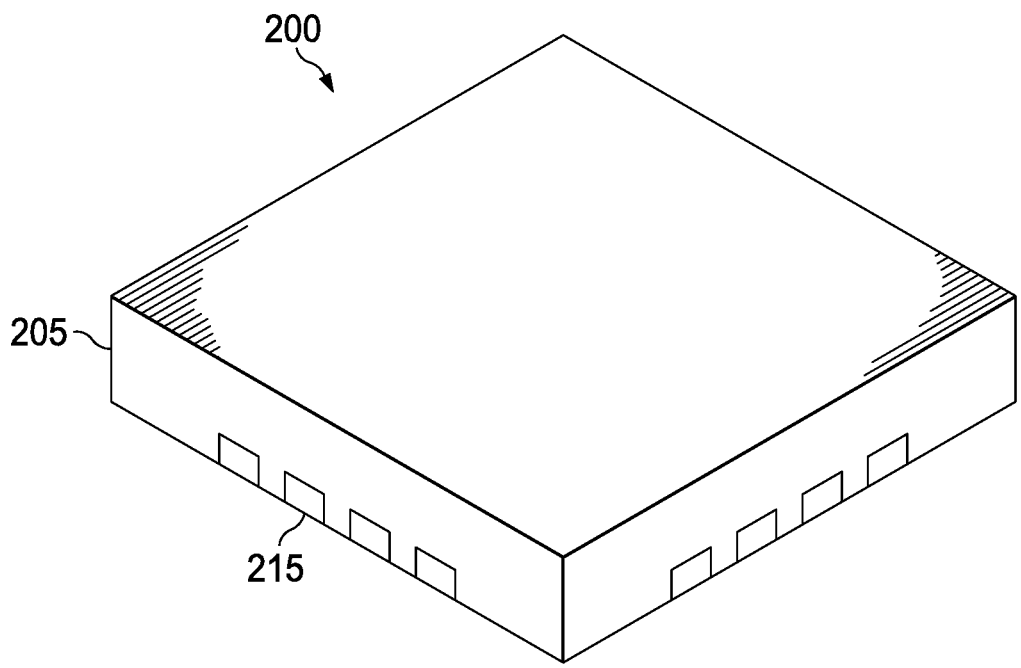
FIGS. 2A-2D are projection views of packaged semiconductor devices.
Figure 2B:
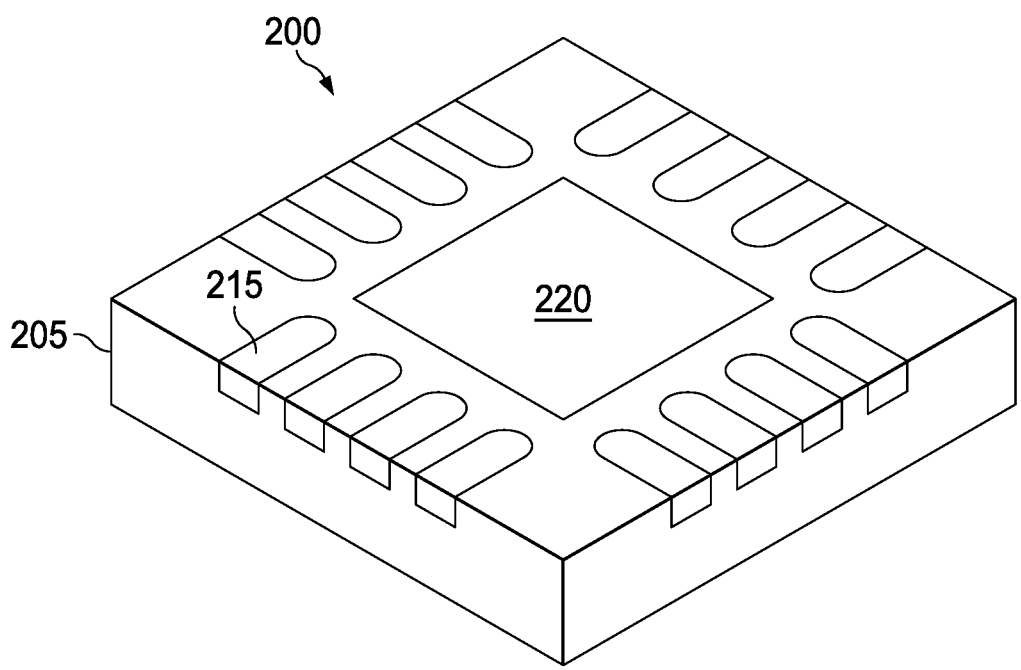
Figure 2C:
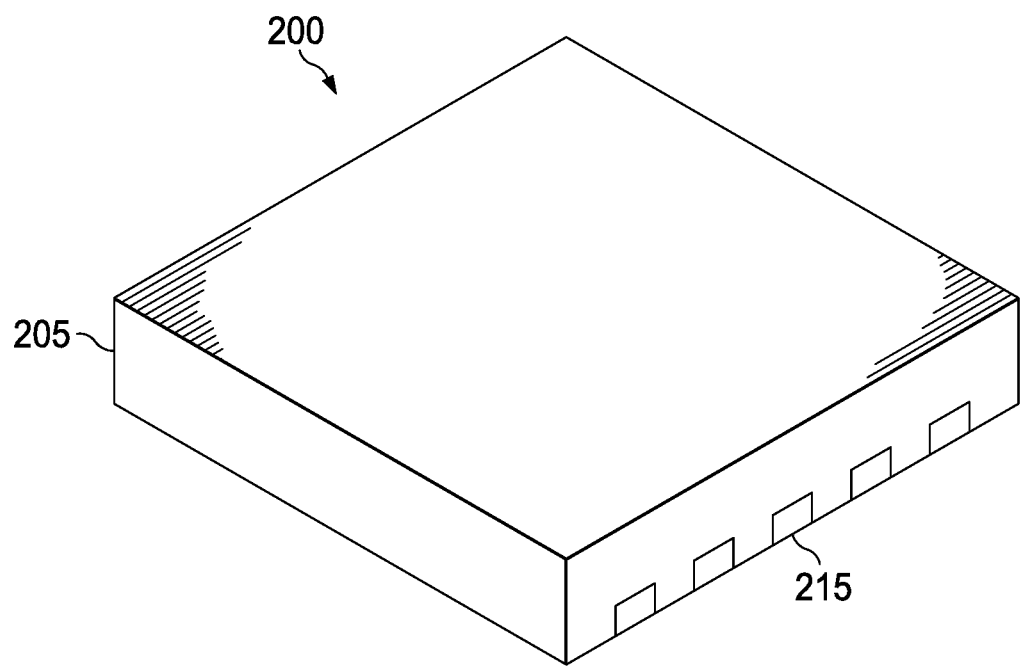
Figure 2D:
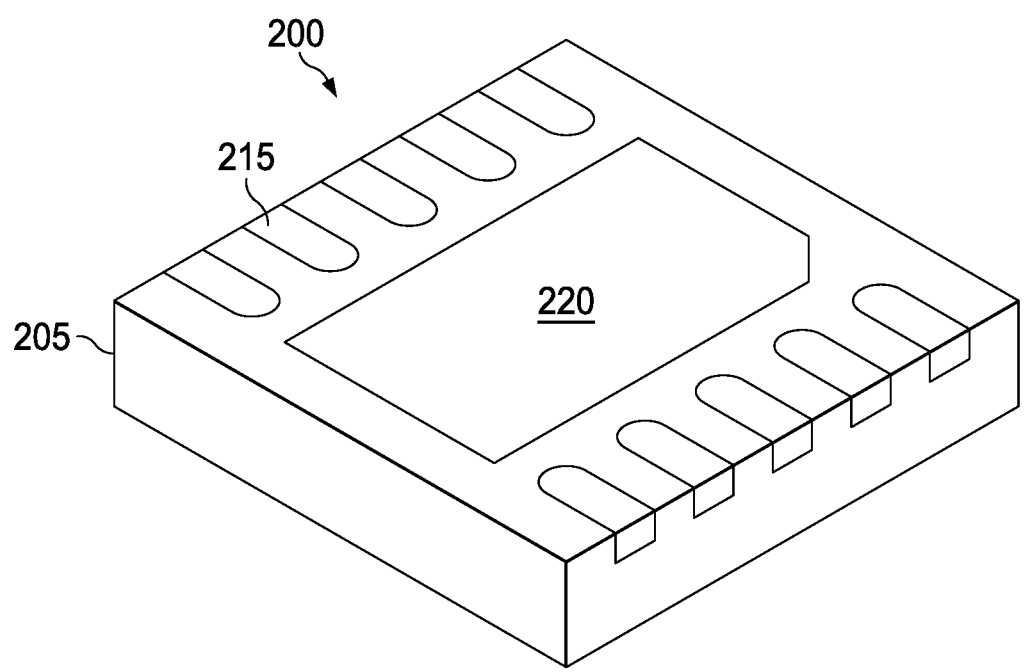

FIGS. 2A-2D are projection views of packaged semiconductor devices showing top and bottom views. In FIG. 2A, a top and side view of a quad flat no-lead (QFN) packaged semiconductor device 200 is shown. In FIGS. 2A-2D, similar reference numerals are used for similar elements in FIG. 1, for clarity of explanation. For example the package 200 corresponds to the package 100 in FIG. 1. In FIG. 2A, the package 200 includes a body of a mold compound 205 with leads 215 forming terminals of the packaged semiconductor device. In FIG. 2B, the bottom surface and side surfaces are shown of the quad flat no-lead package 200 of FIG. 2A, with an exposed surface of thermal pad 220 not covered by mold compound 205 to allow for thermal energy dissipation, and the exposed portions 215 of the leads forming the terminals of the package 200, while mold compound 205 forms the body of the package 200. FIGS. 2C and 2D show a top view and bottom view of a small outline no-lead (SON) packaged semiconductor device. The package 200 in FIG. 2C has a body 205 with terminals 215 on two opposing sides (only one side with terminals is visible in FIG. 2C), instead of four sides as for the package 200 in FIG. 2A. In FIG. 2D, the bottom surface and the sides of package 200 in FIG. 2C are shown. In FIG. 2D, the thermal pad 220 and the exposed portions of the leads 215 are shown exposed from the mold compound 205 to form terminals for the packaged semiconductor device. As shown in FIG. 2D, the terminals are formed on two opposing sides of the packaged semiconductor device in the SON package.

Figure 3:
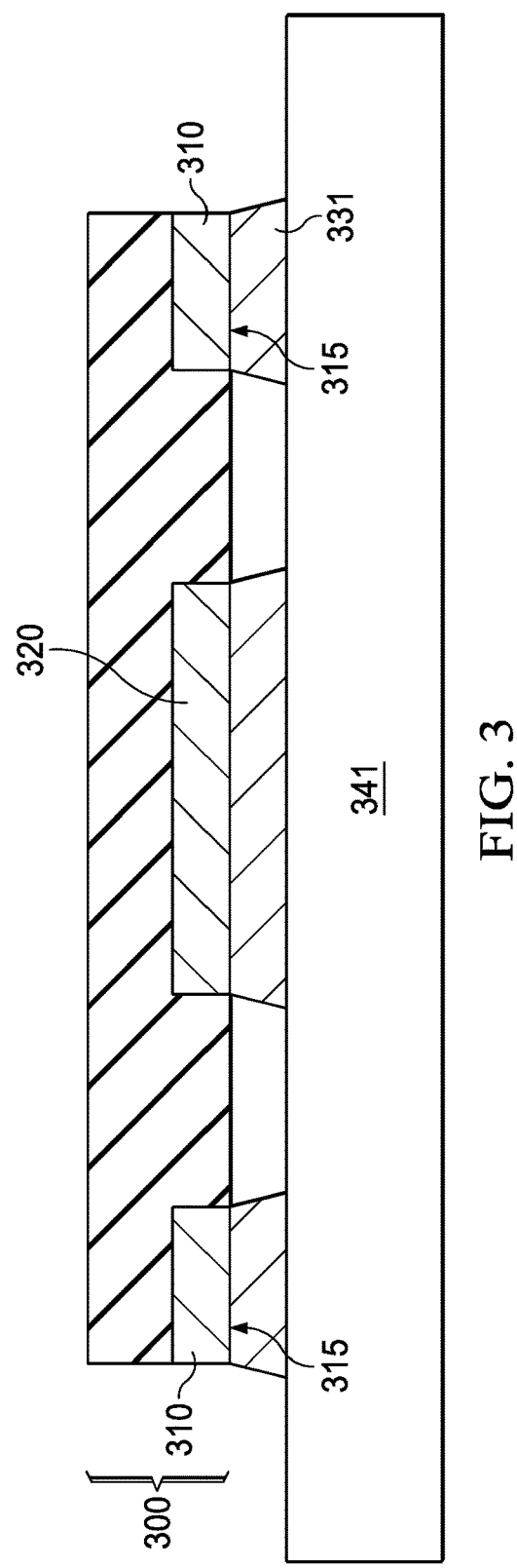
FIG. 3 is a cross sectional view of a packaged semiconductor device mounted to a circuit board.

In FIG. 3, a cross sectional view illustrates a packaged semiconductor device 300 mounted to a printed circuit board 341. Solder joints 331 are shown coupling the terminals 315 of the packaged semiconductor device 300 to lands (not shown in the cross sectional view of FIG. 3, for clarity) on printed circuit board 341. The exposed portions of the leads 310 of the package 300 form terminals 315 for the packaged semiconductor device 300 that are used to electrically couple the packaged device 300 to the board 341. The exposed portion of thermal pad 320 is used to provide a thermally conductive path to a land on the printed circuit board 341. Thermal energy is transferred from the semiconductor die inside package 300 (not shown, but see die 101 in FIG. 1), to the printed circuit board. However, the printed circuit board 341 can become thermally saturated and therefore unable to provide an effective thermal dissipation path, or in some cases may reverse the thermal dissipation path and heat the packaged semiconductor device 300, causing a performance degradation. In some applications, the amount of current that can be carried by a power semiconductor device may be reduced to prevent overheating, even though the current ratings for the power device may be higher; in this example the system is unable to support the maximum performance for the packaged semiconductor device due to thermal transfer limitations.

Figure 4A:
FIGS. 4A-4E illustrate in a series of cross-sectional views the major steps of a method for forming a package substrate used in a packaged semiconductor device.

FIGS. 4A-4E illustrate in a series of cross sections the major steps used to form a package substrate (see 408 in FIG. 4E) that corresponds to the package substrate 108 in FIG. 1. In FIG. 4A, the method begins by providing a base material such as a copper sheet or strip 409. Other conductive materials such as copper alloys, Alloy 42, stainless steel, and materials coated with copper or other conductors, can be used for the base layer 409.

Figure 4B:
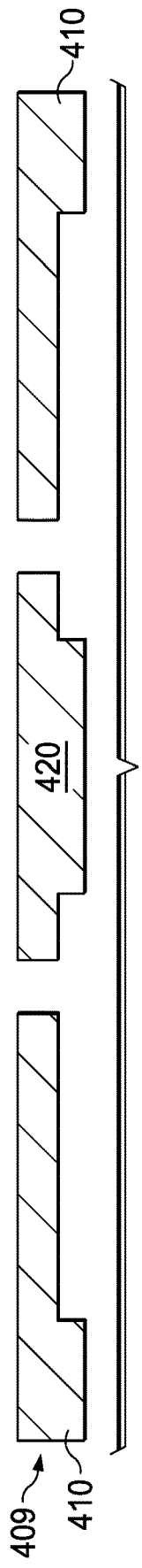

In FIG. 4B, the base layer 409 is shown after partial etch steps are performed to pattern openings and trenches in the base layer 409. By etching the base layer from both top and bottom sides (as oriented in FIG. 4B), a variety of shapes can be formed including trenches, slots, and through holes. In areas where etch is performed on one side, the pattern forms a trench or slot that is closed. In areas where etches are performed on both sides of the base layer, through holes are formed. As shown in FIG. 4B, leads 410 can be shaped to have a thinner portion and a full thickness portion of the base layer 409. The leads can be severed from one another and from a thermal pad 420 by through holes that extend completely through the base layer 409.

Figure 4C:
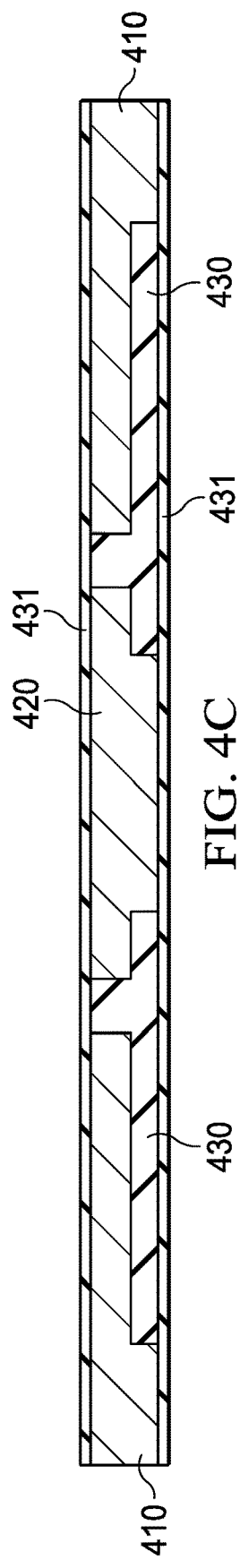

In FIG. 4C a pre-mold dielectric material such as a plastic, epoxy or resin material 430 is applied to the base layer 409 in a molding operation. Flash material 431 is left over the surfaces of the base layer outside the openings that are filled with the pre-mold material 430.

Figure 4D:
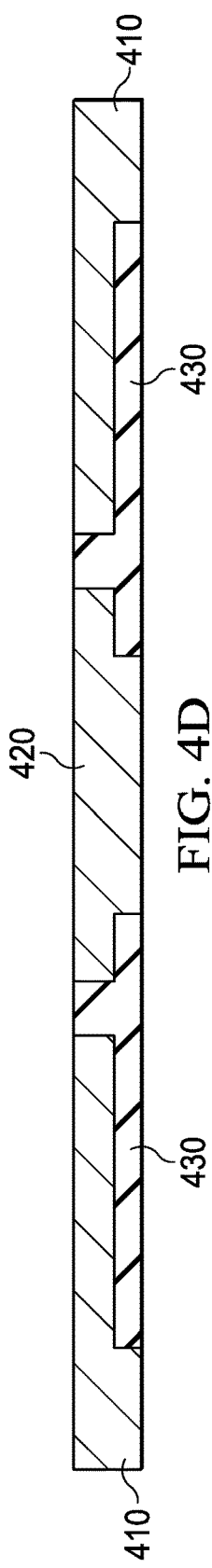

In FIG. 4D, the flash material 431 is removed to expose the surfaces of the base layer 409, which can be for example a copper substrate.

Figure 4E:
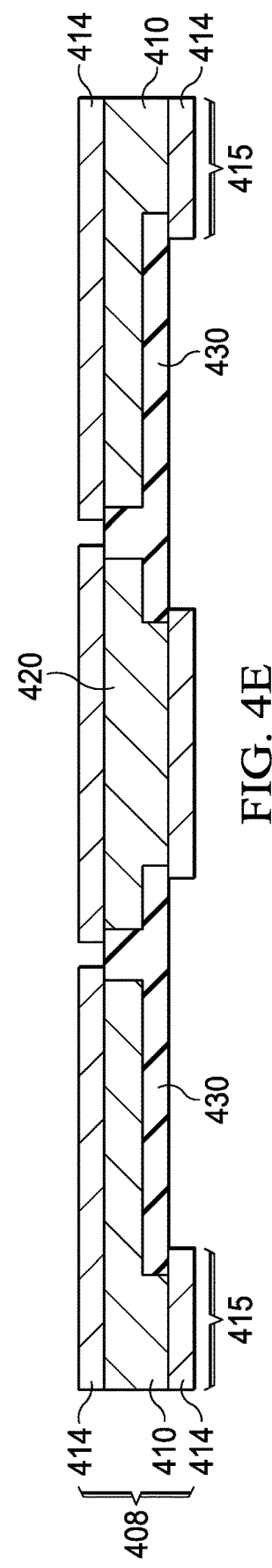

In FIG. 4E, the areas that require bondable plating layers are plated with layer 414. In an example, a nickel, palladium, gold plating system (Ni/Pd/Au) is formed over a copper substrate. In other arrangements, the plating system used is a nickel-gold (Ni/Au) plating system. Use of these plating layers 414 reduces corrosion by preventing copper ions from reacting with the air, and increases bondability and solderability for use with bond wires and solder in subsequent process steps. The package substrate 408 is arranged to receive a semiconductor device die (see, for example, FIG. 1). The package substrate 408 is a "premolded" lead frame or PMLF, with the dielectric 430 formed between conductive leads 410. The PMLFs can be provided in a strip or in an array of rows and columns of individual leadframes coupled together by removable portions, for processing. The leadframe portions 415 will form terminals for the completed packaged semiconductor device. When a semiconductor device is mounted to the leadframe and subsequently mold compound is applied to form a package as is described further hereinbelow, portions of the leadframes such as 415 will be left uncovered by the mold compound to form terminals, for example see FIGS. 2A-2D.

FIGS. 5A-5E illustrate in a series of cross sectional views the major steps for forming a packaged device carrier. A packaged device carrier substrate is formed using etching and molding processes similar to those for forming a package substrate as shown in FIGS. 4A-4E. In FIG. 5A a base layer 559, which may be a copper strip or substrate, is shown in a cross-section. At FIG. 5B, the base layer 559 is shown with a patterned opening 561 formed by the use of partial etch steps from both sides, so that as the base layer is oriented in FIG. 5B, the lower portion of opening 561 can be formed wider than the upper portion of opening 561. In an example, the base layer 559 can be in a thickness range from about 150 microns to about 250 microns. Partial etch processes allow for various thickness portions of the substrate 559 to be formed, by etching from one side, and then from the other side, using differing etch patterns, in addition openings in the substrate can be formed by etching from both sides. Because the partial etching process is used the openings can be formed with different sizes on the two sides of substrate 559, as shown for opening 561 in FIG. 5B.

At FIG. 5C., the opening 561 (see FIG. 5B) is shown now filled with a dielectric material 563. The dielectric material 563 can be a resin, epoxy, plastic or other dielectric material. The dielectric can be formed using a molding process, and mold flash that results on the surfaces of base layer 559 can then be removed (see FIG. 4D, for example) but for simplicity of explanation this step is not shown.

At FIG. 5D, the base layer (see 559 in FIG. 5A) is further etched to form a substrate 565. As oriented in FIG. 5D, the base layer 559 is etched from the bottom side of base layer 559 to thin the substrate 565. In FIG. 5E, the package carrier 560 is shown after leads 568 and 567 are formed on opposing sides of the dielectric material 563 by plating the copper layer 565. The platings can be of nickel, gold, palladium, silver, tin or other layers and can be applied to increase bondability and solderability, and to reduce corrosion of the package carrier 560. The leads 567, 568 have a head portion 566 that is attached to and secured by the dielectric 563, a middle portion 564 that extends from the head portion and away from the dielectric 563, and an end portion 562 that extends from the middle portion with a foot portion 576 which, as is described hereinbelow, will be arranged for mounting to a board or substrate. After the etching steps are completed, the leads 567, 568 can have a final thickness that is a partial thickness compared to the starting thickness, for example a thickness of about 100 microns to 200 microns.

Figure 6A:
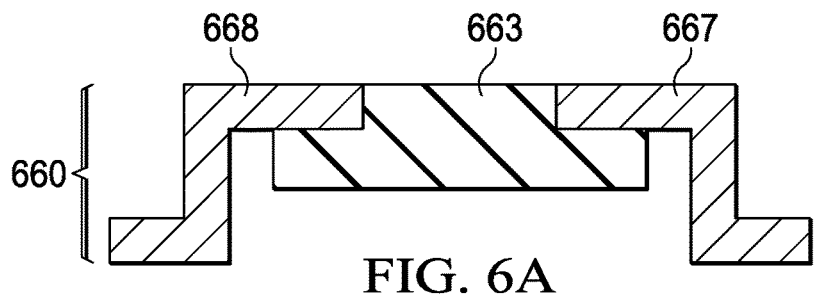
FIGS. 6A-6B, 6AA-6BB, and 6C illustrate in cross-sectional views and a projection view of packaged device carriers for use in arrangements.
Figure 6A:
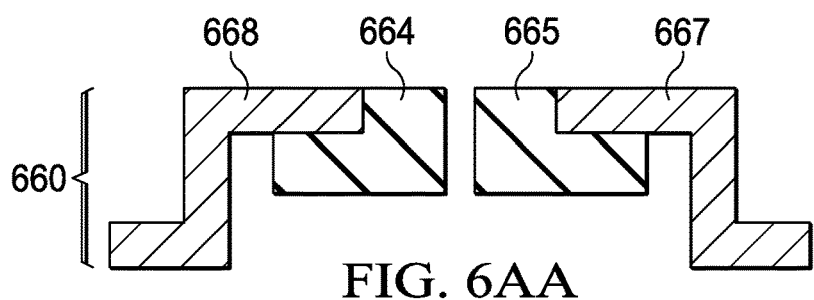

FIGS. 6A, 6AA, 6B, and 6BB are cross sectional views of packaged device carriers formed using methods similar to the method illustrated in FIG. 5A-5E, and further showing the packaged device carriers after the leads are formed into desired shapes. In FIG. 6A, the leads 668, 667 are attached to dielectric 663 and are shaped to have straight vertical middle portions with horizontal "feet" (as the device is oriented in FIG. 6A) for surface mounting to a printed circuit board. The leads extend from a "board side" surface of the packaged device carrier that is a surface that is configured to face a printed circuit board when the packaged device carrier is mounted to the printed circuit board, (the bottom surface as oriented in FIGS. 6A-6E). The packaged device carrier has an opposite or opposing surface that faces away from the board side surface (the top surface as oriented in FIGS., 6A-6E), the packaged device carrier can have a packaged semiconductor device mounted on either the board side surface or on the opposite surface in the arrangements, as is described hereinbelow. Lead forming equipment used for leaded semiconductor packages can be used to shape the leads 668, 667. In FIG. 6AA, the packaged device carrier 660 is shown after a sawing operation cuts through the dielectric 663 in a middle portion to form two portions (labeled 664, 665) of the packaged device carrier, each portion referred to as "sleeves." The sawing operation can be a mechanical blade similar to those used to cut through molded packages in package singulation operations.

Figure 6B:
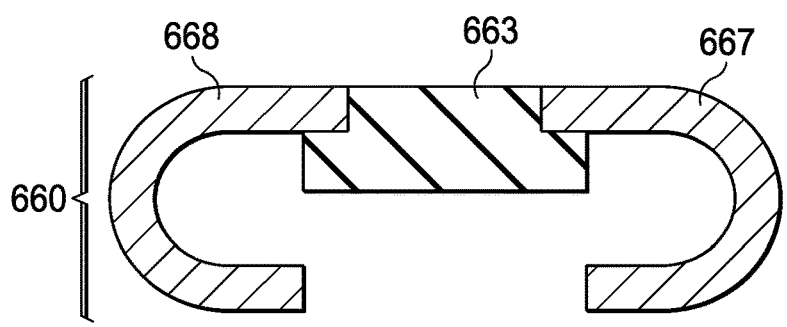
Figure 6B:
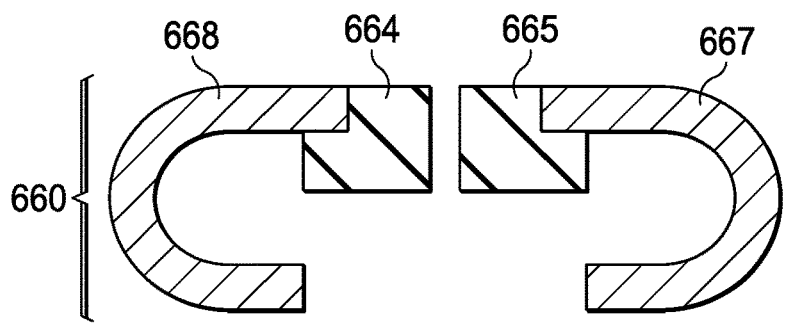
Figure 6C:
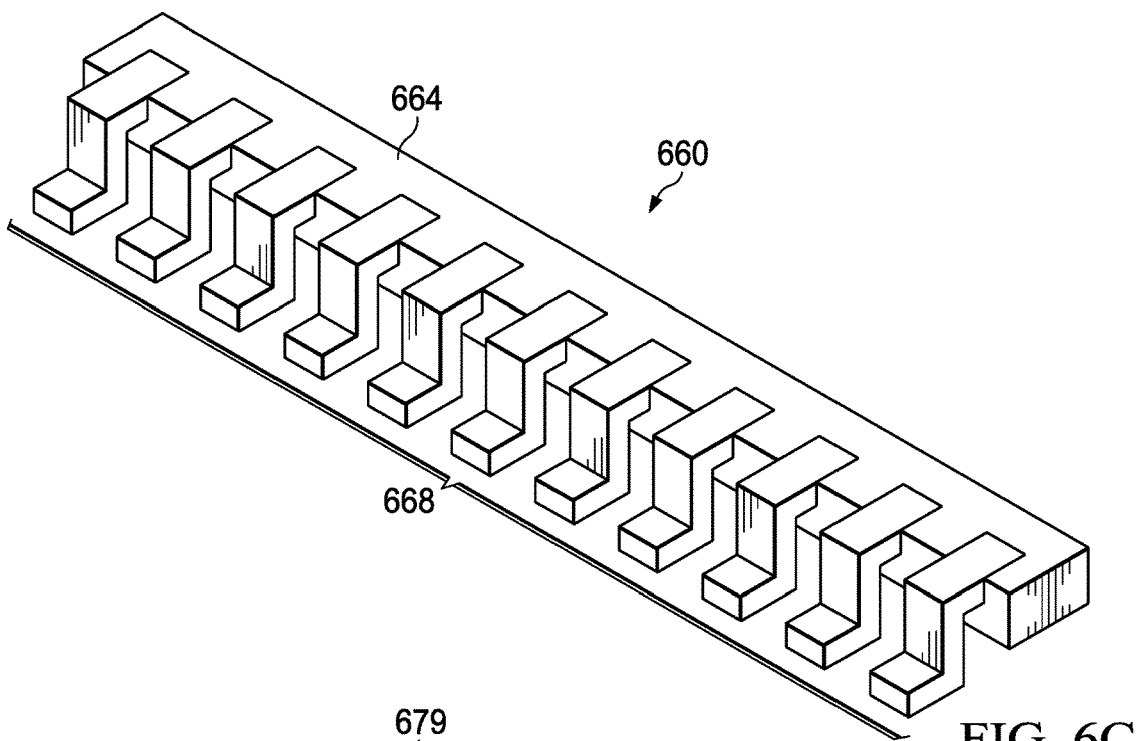
FIGS. 6D-6E illustrate detailed views of one of the leads used differing arrangements.

FIG. 6B illustrates in an alternative example a cross sectional view of a packaged device carrier 660 with "C-shaped" leads. The leads 667, 668 can be formed after the methods in FIGS. 5A-5E and can be formed using "trim and form" lead forming equipment such as is used for leaded packages. In FIG. 6B the exposed ends of the leads have a foot portion for surface mounting to a board or substrate, the foot portion is parallel to the upper surface of the packaged device carrier 660, as oriented in FIG. 6B. In FIG. 6BB, the packaged carrier substrate 660 of FIG. 6B is shown after a mechanical sawing operation. In FIG. 6C a projection view of a packaged device carrier sleeve formed in FIG. 6AA is shown with a group of leads 668 arranged along one sleeve 660 that will be used in an arrangement with a packaged semiconductor device, as is further described hereinbelow. The leads are arranged in parallel to one another in a row corresponding to a row of terminals on a packaged semiconductor device and are secured by dielectric 664.

Figure 6D:
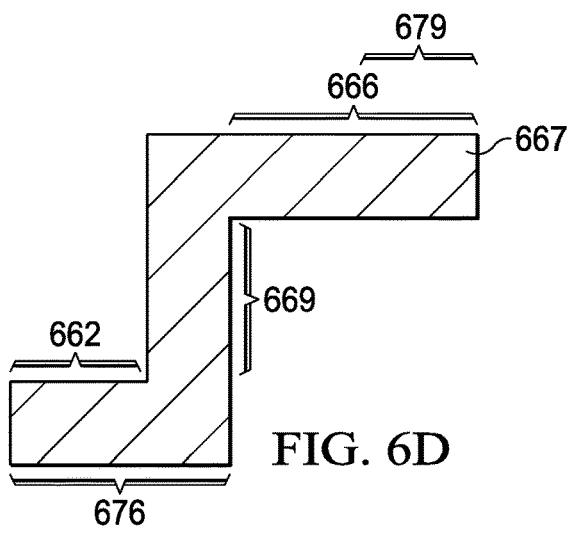

In FIG. 6D, an example lead 667 of FIG. 6AA is shown in detail. The lead 667 has a head portion 666 with a conductive land area 679, a middle portion 669, and an end portion 662 with a foot portion 676. After the lead is shaped, the head portion 666 is attached to and coplanar with the upper surface of the dielectric 664 with a middle portion 669 arranged perpendicular to the head portion 666 and extending away from the dielectric (perpendicular in FIG. 6D as angled at a normal angle to the head portion and extending downward as shown in FIG. 6D, FIG. 6A etc.) and the end portion 662 is angled with respect to the middle portion and is horizontal (as oriented in FIG. 6D) and forms a foot portion 676 on the bottom surface of lead 667 (bottom surface as oriented in FIG. 6D). In alternatives, the middle portion 669 can be at a lesser angle than normal with respect to the head portion 666 and can slope away from the dielectric 664 (see FIG. 6C.)

Figure 6E:
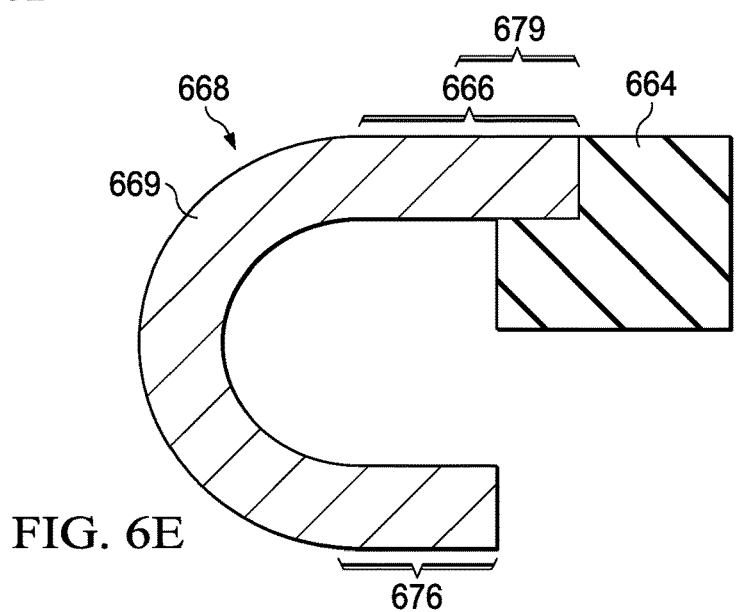

A lead from the packaged device carrier shown in FIG. 6BB is shown in detail in FIG. 6E. This semicircular shaped lead 668 (semicircular in the cross section) has a head 666 with a conductive land area 679, a middle portion 669, and an end portion 662, with a foot portion 676. The dielectric 664 is shown surrounding a portion of the head portion 666. The dielectric holds and protects the head portion 666 of lead 668 with the conductive land 679 exposed to make an electrical and physical contact surface for a terminal of a packaged semiconductor device (not shown) to be mounted to the lead 668.

FIGS. 7A-7E illustrate in a series of cross sections the major steps for forming an alternative arrangement for a packaged device carrier. In this alternative arrangement, the packaged device carrier will include a thermal portion arranged between two rows of leads.

Figure 7A:
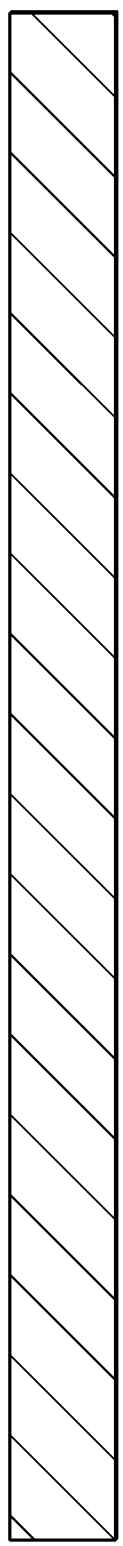
FIGS. 7A-7E illustrate in a series of cross-sectional views the major steps for forming a packaged device carrier with an integrated thermal pad for use in an arrangement.
Figure 7B:
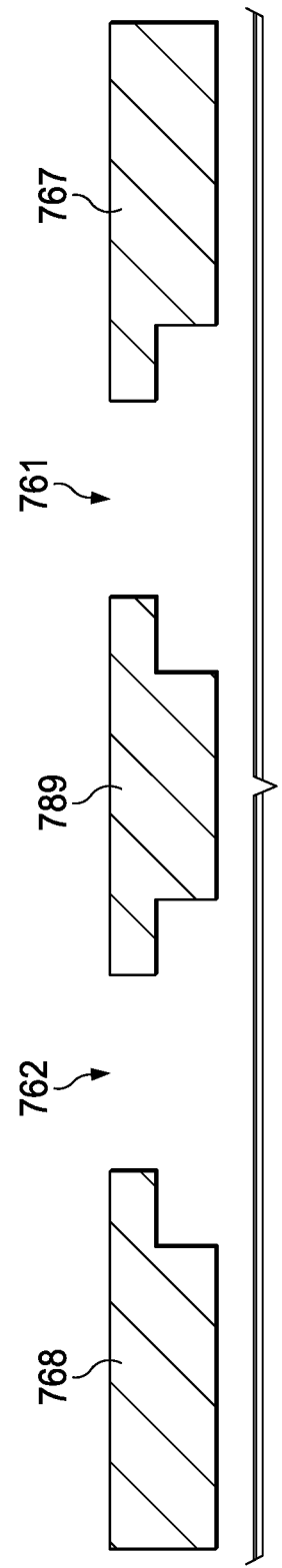
Figure 7C:
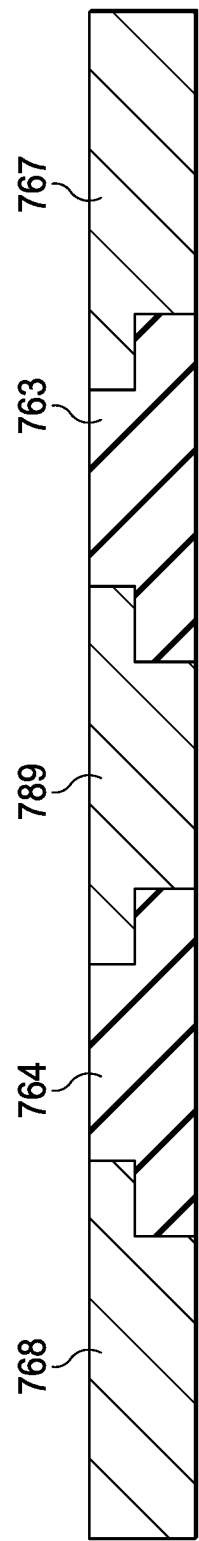

In FIG. 7A a strip or array of conductive material 759 is provided. In an example a copper or copper alloy substrate material is used. FIG. 7B illustrates in a cross section the material after partial etching is performed from both the top and bottom surfaces to form conductive leads 768, opening 762, a thermal pad 789, an opening 761, and additional conductive leads 767. In FIG. 7C a cross section illustrates the results of a premold operation that forms dielectric materials 764, 763 in the openings 761, 762 shown in FIG. 7B. The premold operation can deposit dielectrics such as resins, epoxies, plastics, thermoplastics, liquid crystal polymers, thermoset mold compound and other dielectrics. In one approach a transfer molding operation heats a solid mold compound to a liquid state, transfers the molding compound in a mold press, and then cures the mold compound to form the dielectric materials 764 and 763 in FIG. 7C. In additional examples a room temperature mold compound can be used. Curing by temperature or UV exposure can be performed to cure the dielectric.

Figure 7D:
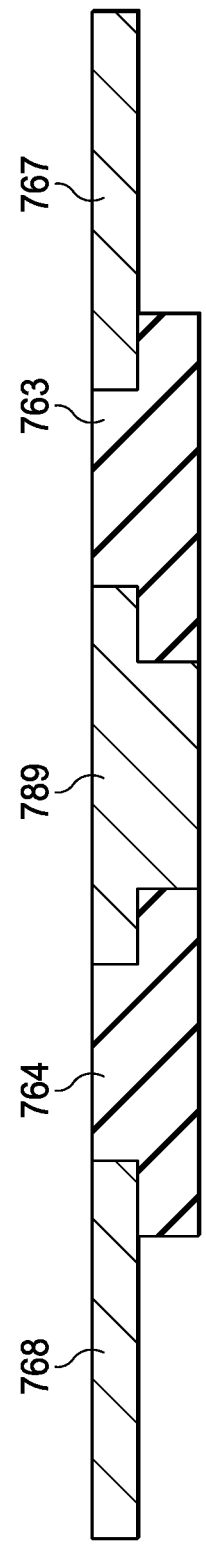
Figure 7E:
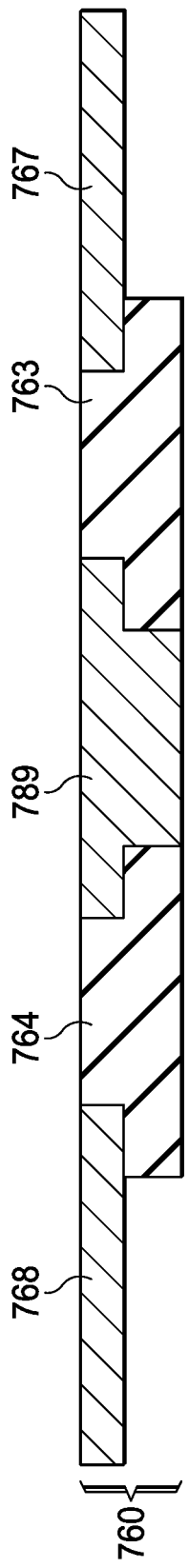

At FIG. 7D, the conductive leads 768, 767 in FIG. 7C are shown after an additional thinning etch is performed from the bottom surface to thin the leads. At FIG. 7E the packaged device carrier 760 is shown after an additional plating operation is used to form a plated layer over leads 768 and 767, and on thermal pad 789. Silver, nickel, tin, palladium, gold, nickel gold alloy or layers of these, nickel gold palladium alloys or layers of these, are all possible plating arrangements that will increase bondability and solderability of the conductive leads.

Figure 8A:
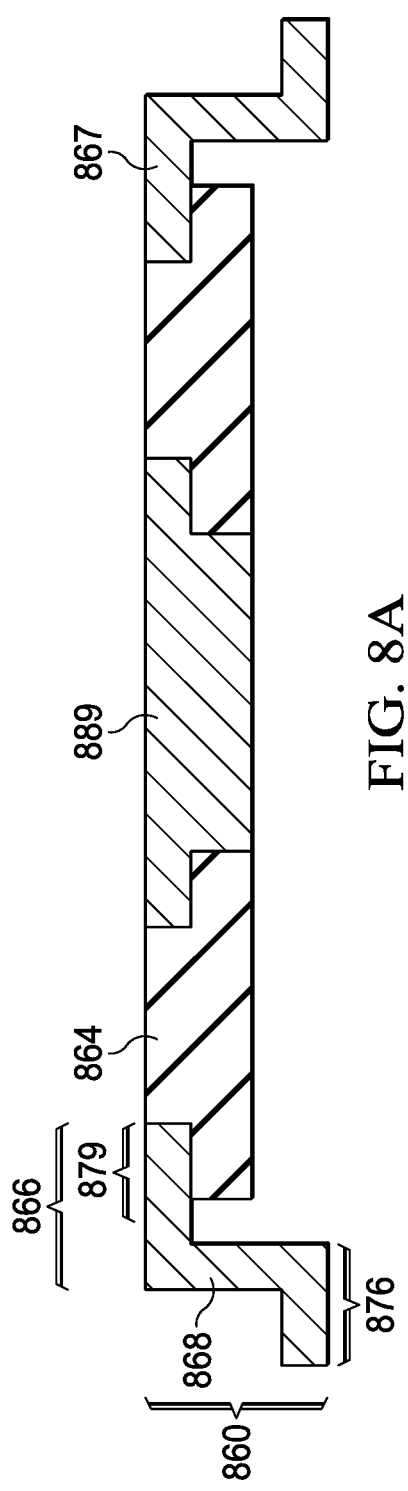
FIGS. 8A-8B illustrate in cross sectional views example packaged device carriers for use with arrangements.
Figure 8B:
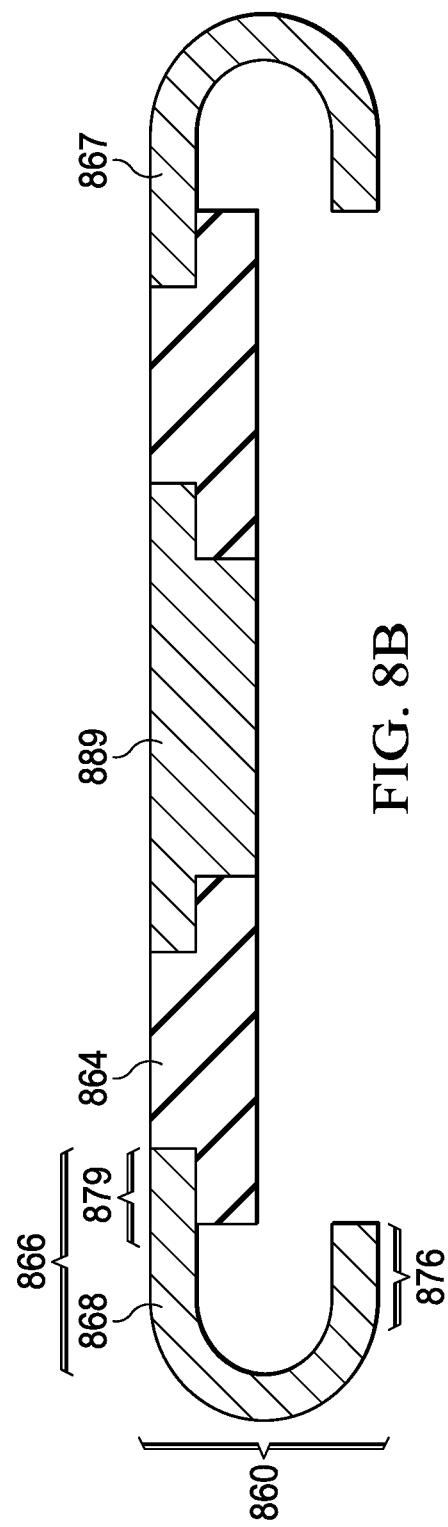

FIGS. 8A-8B show packaged device carriers 860 formed following the steps of FIGS. 7A-7E by shaping the leads. In FIGS. 8A-8B the reference numerals used are similar to those in FIGS. 7A-7E for similar elements, for example the packaged device carrier 760 corresponds to packaged device 860. In FIG. 8A the leads 868 and 867 are formed to have a vertical middle portion extending from head portion 866 attached to the dielectric 864 and each lead has a horizontal foot portion 876 (horizontal as oriented in FIGS. 8A-8B) for surface mounting. A land portion 879 is exposed from dielectric 864 for making an electrical contact with a terminal of a packaged semiconductor device (not shown for clarity).

In FIG. 8B the leads 868 and 867 are shaped into "C-shaped" leads and have a foot portion 876 at the exposed ends for surface mounting to a substrate such as a printed circuit board (not shown). The C-shaped leads 868 have head portions 866 with exposed lands 879 for mounting a packaged semiconductor device (not shown).

Figure 8C:
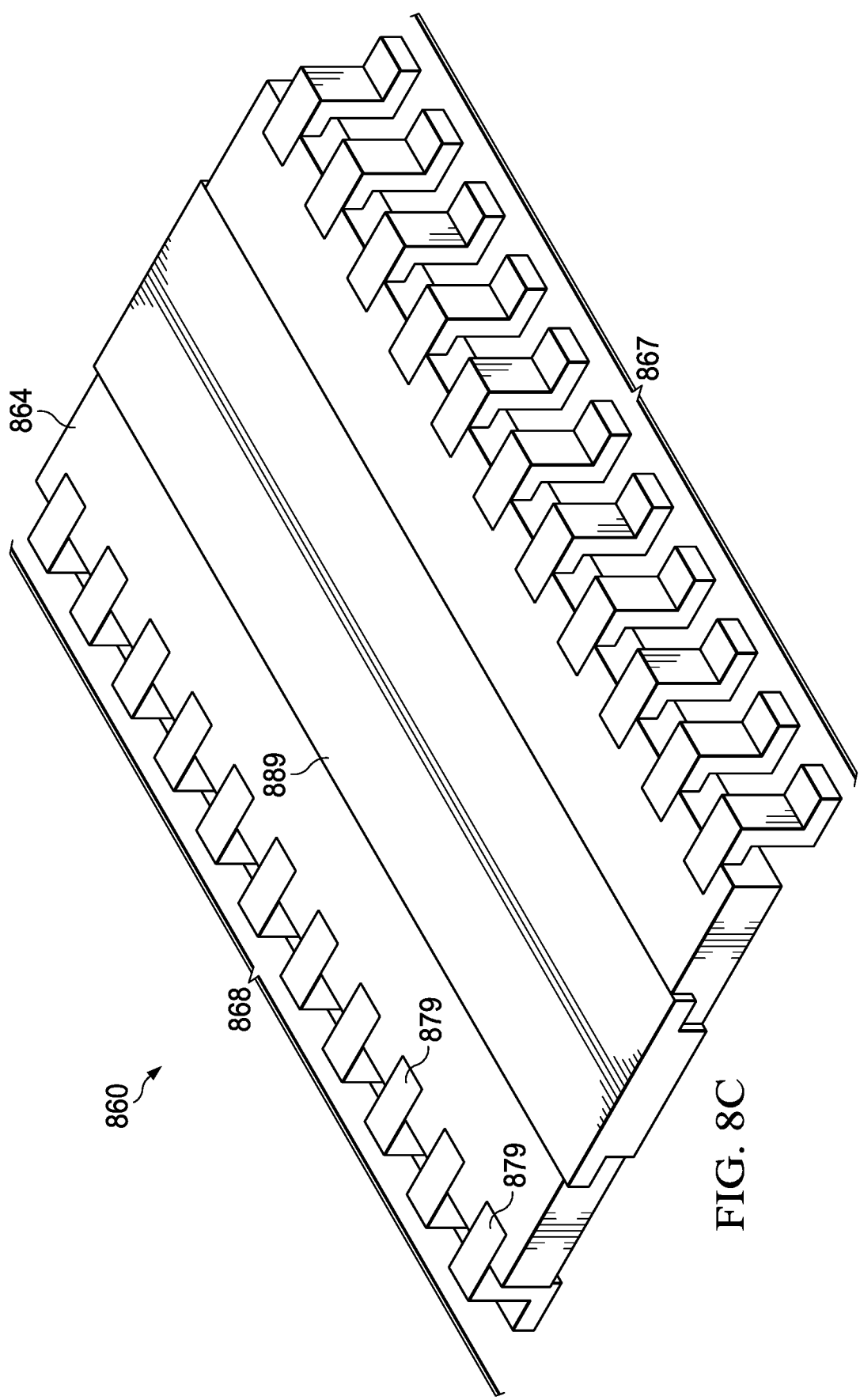
FIG. 8C is a projection view of the example packaged device carrier.

Each of the arrangements in FIGS. 8A-8B has a thermal pad 889 in a central portion which will make mechanical contact with a thermal pad of a packaged semiconductor device mounted to the carrier, as is described further hereinbelow, and thus provides a thermally conductive path to remove thermal energy from a packaged semiconductor device that is to be mounted to the package device carrier 860. FIG. 8C is a projection view of the packaged device carrier 860 shown in FIG. 8A, with thermal pad 889 extending through a central portion, and a group of conductive leads 868 extending from one side while a second group of conductive leads 867 extends from a second opposing side. Each lead has a land portion 879 exposed from the dielectric material of the packaged device carrier 860 that corresponds to the terminals of a packaged semiconductor device (not shown) that will be mounted to the packaged device carrier, so the terminals of the packaged device will make electrical contact to the leads.

Figure 9A:
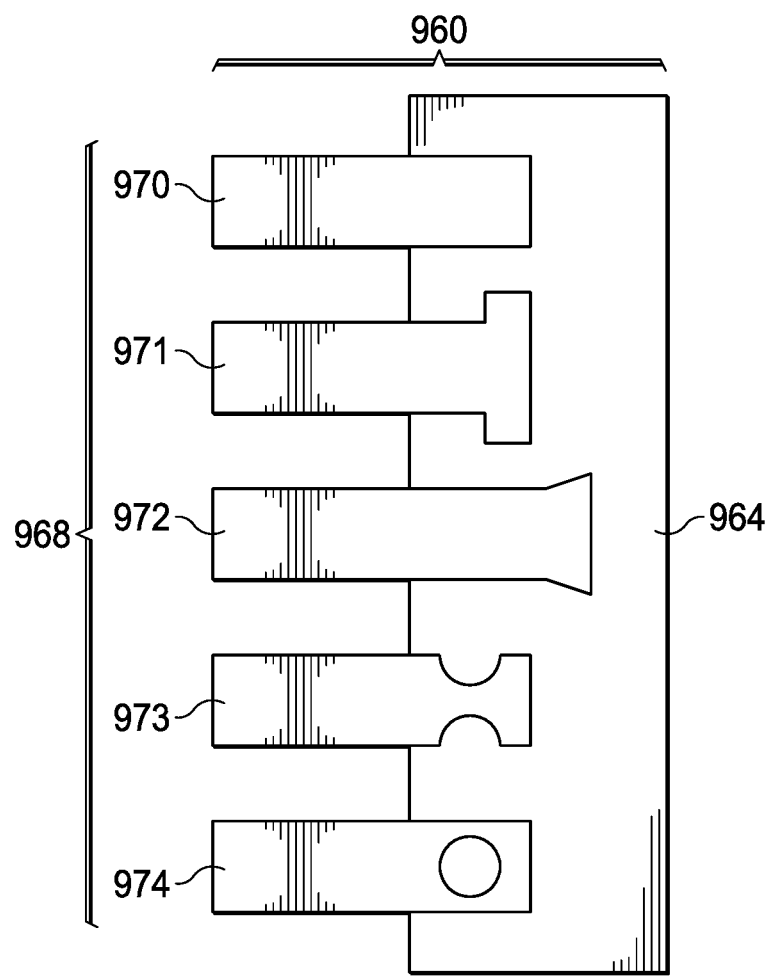
FIG. 9A is a plan view of an example packaged device carrier illustrating several mold lock features of various arrangements.

FIG. 9A-9D illustrate features that can be used in additional arrangements to increase lead lock to the dielectric in the packaged device carriers. FIG. 9A illustrates in a top view various shapes of the head portions of leads that can be used with the arrangements to provide increased mechanical reliability by forming "lead locks" between the head portions of conductive leads and the dielectric material in the packaged device carriers such as 860, 760. In FIG. 9A, the leads 968 correspond to leads 868 and in FIGS. 8A-8C, for example. The dielectric material 964 has leads 968 embedded in it. The head portions of the leads in contact with the dielectric material can be shaped to increase the contact area and to increase the strength of the joint between the leads and the dielectric. Lead 970 is a straight shape without additional lead lock shapes. Lead 971 has a "T" head shape. Lead 972 is flared to extend the head portion. Lead 973 has been stamped to form semicircular openings on opposing sides of the head portion. Lead 974 has an opening punched or etched through the head portion to lock the lead to the dielectric.

Figure 9B:
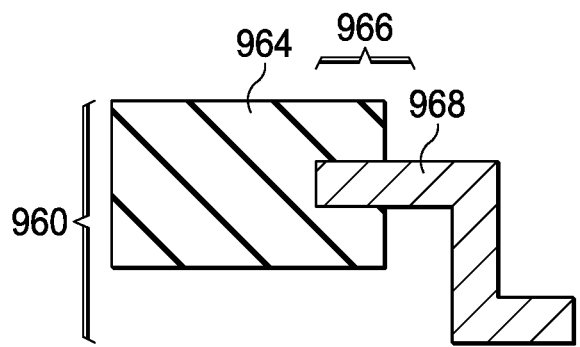
FIGS. 9B-9D illustrate in cross sectional views additional mold lock features of additional arrangements.
Figure 9C:
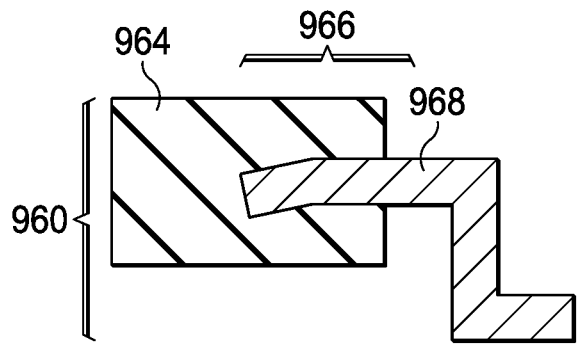
Figure 9D:
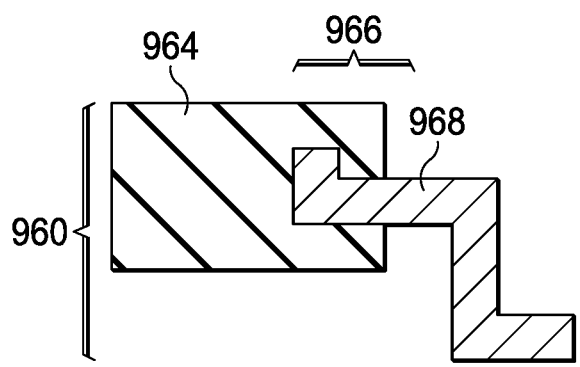

FIGS. 9B-9D illustrate shapes that can be used at the head portion 966 of the leads 968 that are joined to the dielectric to increase reliability. In FIG. 9B, a cross sectional view illustrates a straight shaped head portion 966 for an arrangement without the additional locking shape. In FIG. 9C, an alternative example shows a depressed shape at the head portion 966 of the lead that is joined to the dielectric, increasing mechanical strength of the joint. Note that the stamped, etched punched features of FIG. 9A can be combined with the depressed shape of FIG. 9C to form additional alternative lead shapes. In FIG. 9D, the head portion 966 of the lead that joins the dielectric in the packaged device carrier is formed into an upwards bend to increase mechanical strength of the joint. Further the upwards bend shape of FIG. 9D can be combined with the stamped, punched or etched shapes in FIG. 9A to form additional lead shapes.

FIGS. 10A-10B illustrate in cross sectional views alternative arrangements packaged device carriers with a packaged semiconductor device mounted to a first surface of the packaged device carrier. While the cross sectional views show leads only on two opposing sides of the example packaged devices, note that the leads can also be formed on the two ends of the packaged device carrier (not visible in the cross sections of FIGS. 10A-10B) to form "quad" lead packaged device carriers. In these arrangements the packaged device 1000 is mounted on a surface facing away from the system board (not shown for clarity) that the packaged device carrier will eventually be mounted to (that is the packaged semiconductor device is mounted to the upper surface of packaged device carrier 1060 as oriented in FIG. 10A). As is further described hereinbelow, in alternative arrangements the packaged device can be mounted on the board side surface of the packaged device carrier (that is, the bottom surface of the packaged device carrier as oriented in FIG. 10A.)

In FIG. 10A, the cross section illustrates a packaged semiconductor device 1000 in a quad flat no lead (QFN) or small outline no lead (SON) package with leads 1010 and terminals 1015, and having an exposed thermal pad 1020 that is exposed from the package body, a mold compound or dielectric 1005. A packaged device carrier of the arrangements 1060 with C-shaped leads is shown with the packaged semiconductor device 1000 mounted to a first planar surface of the packaged device carrier 1060. In the example arrangement, the packaged semiconductor device 1000 is mounted to the first surface of packaged device carrier 1060 which is a surface facing away from the exposed or foot ends of the leads 1067, 1068, that is facing away from the surface of a printed circuit board that the packaged device carrier 1060 may later be surface mounted to (not shown for clarity). A solder joint or conductive epoxy is used to electrically couple and mechanically bond the upper portions (as oriented FIG., 10A) of lands on the leads 1067, 1068 to the terminals 1015 of the packaged semiconductor device 1000. The leads are joined to dielectric 1064, 1065 forming two sleeves, each forming a row of leads, one sleeve for each side of the packaged semiconductor device 1000 in this cross sectional view. In this example, the leads 1067 and 1068 are shown in a semicircular or "C-shape" in cross section, although other lead shapes can be used to form additional arrangements. The thermal pad 1020 of the packaged device 1000 is open to the ambient and is spaced from the bottom of the leads 1067, 1068 by a distance "D". By spacing the thermal pad of the packaged semiconductor device 1000 away from the point where the packaged device carrier 1060 will be surface mounted to the system board (the system board is not shown in FIGS. 10A-B, for clarity), the ambient atmosphere can cool the packaged semiconductor device 1000 during operation, the thermal energy being transferred from the thermal pad 1020 into the ambient. The distance "D" indicates this spacing which can be made greater or lesser by using different lead lengths and shapes. Additional thermal transfer can be achieved by using forced air beneath the packaged semiconductor device 1000, or by using a liquid coolant or by circulating an inert atmosphere over the thermal pad 1020, for example.

FIG. 10B illustrates an arrangement where the packaged semiconductor device 1000 is mounted to a board side surface of the packaged semiconductor device carrier 1060 with straight shaped leads. In this alternative the packaged semiconductor device carrier 1060 has an integral thermal pad 1089 that is in contact with the thermal pad 1020. The thermal pad 1089 in the packaged device carrier 1060 extends through the dielectric 1064 to provide a thermally conductive path. In some alternative arrangements, the pad 1020 is also an electrical terminal for the packaged device 1000 and thermal pad 1089 provides an electrical connection to the pad 1020 for signal connections. In a specific example, this connection is a source connection to a source terminal of a vertical FET device that is within the packaged semiconductor device 1000.

As shown in FIG. 10B, the packaged semiconductor device 1000 is carried on a board side surface of the packaged device carrier 1060. Because the packaged device 1000 is mounted underneath the packaged device carrier 1060 (as oriented in FIG. 10B) relative to a system board (not shown for clarity) that the assembly will mount to, this arrangement is sometimes referred to as a "possum" carrier. The leads 1067 and 1068 extend from the packaged device carrier 1060 to end in flat or planar feet portions for surface mounting to a board (not shown). The packaged semiconductor device 1000 has a thermal pad 1020 that is in contact with the integral thermal pad 1089 of the packaged device carrier 1060. The packaged semiconductor device is mounted with the terminals 1010 in contact with the leads 1067 on one side and 1068 on the other side of the packaged device carrier 1060. The leads have a vertical (as oriented in FIG. 10B) middle portion 1089 with a length "L" that spaces the packaged semiconductor device mounted to the carrier from a board that the arrangement will be mounted to (not shown) by a distance "D". The integral thermal pad 1089 carries thermal energy from the semiconductor device 1000 and is exposed to the ambient for cooling. Forced air, liquid or gas can be circulated over the packaged device carrier 1060 to provide additional cooling. Because the thermal energy is dissipated away from the system board (not shown) that the arrangement will be mounted to, the thermal status of the board does not affect the thermal state or the performance of the packaged semiconductor device 1000.

Figure 11A:
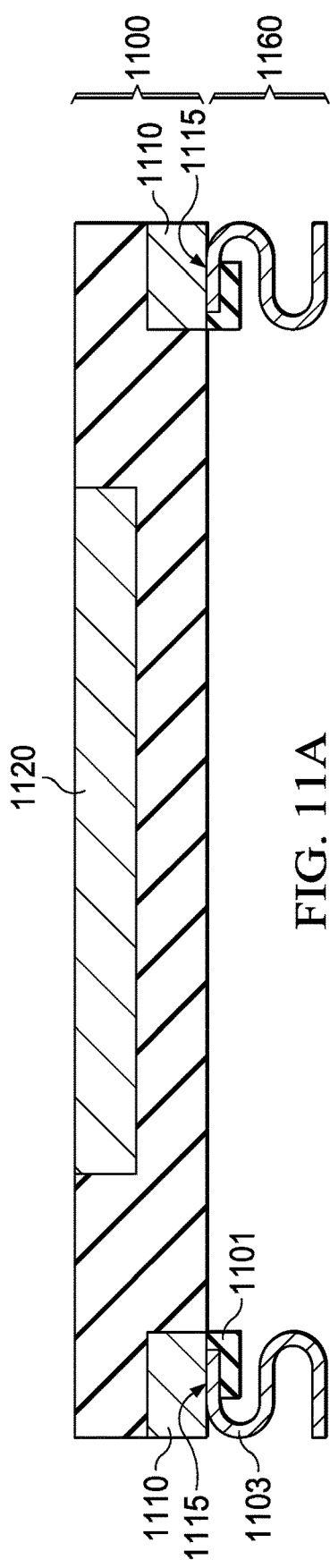
FIGS. 11A-11B illustrate in cross-sectional views packaged device carrier arrangements with alternative lead shapes.
Figure 11B:
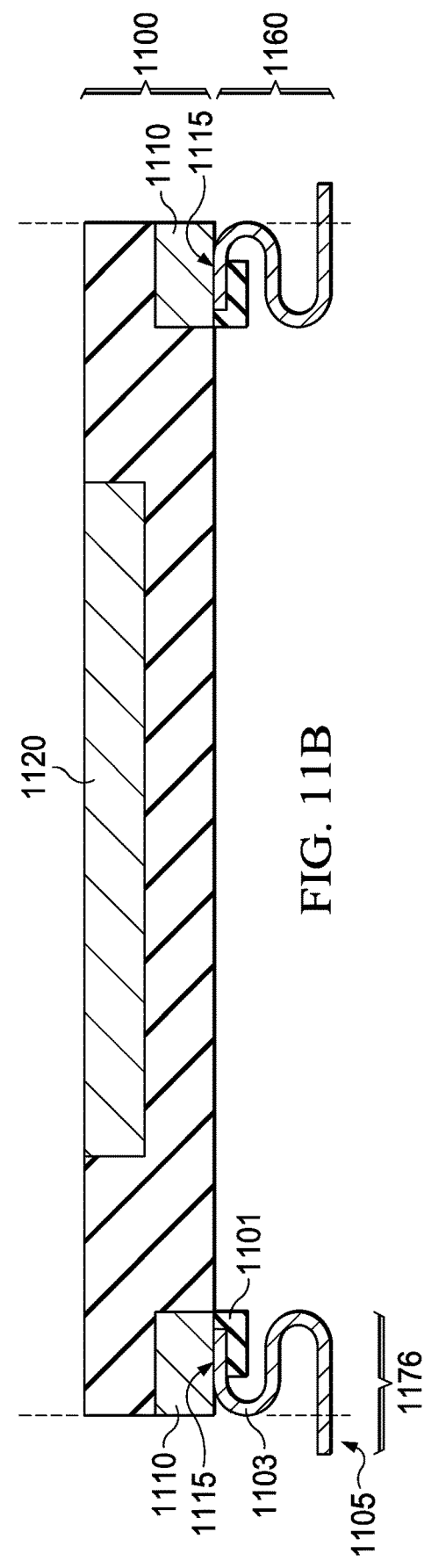

FIGS. 11A and 11B are cross sections illustrating an additional arrangement. In FIGS. 11A-11B, similar references are used for similar elements as used in the figures described above, for clarity. For example, the packaged device carrier 1160 corresponds to the packaged device carrier 1060 in FIGS. 10A-10B.

In FIG. 11A, the packaged device carrier 1160 is shown with a packaged semiconductor device 1100 mounted on a surface. In this example the packaged device is mounted on a surface of the packaged device carrier facing away from a system board (not shown). The packaged device carrier 1160 has leads 1103 shaped in an "S" shape mounted on dielectric 1101. The leads can support the packaged semiconductor device 1100 and have some mechanical flexibility or act as "springs." Because the leads 1103 can move in response to mechanical or thermal-mechanical stress that may occur during device operations, the board level reliability (BLR) is increased by the use of the arrangements. The head portions of the S shaped leads 1103 are arranged to correspond to the terminals 1115 of the leads 1110 of the packaged semiconductor device 1100, so that the exposed lands of the leads 1103 can be soldered to the terminals 1115 of the packaged semiconductor device and make connections to the leads 1110.

FIG. 11B illustrates an alternative arrangement where a portion 1105 of the "foot" portions 1176 of the leads of the semiconductor device carrier 1160 extends outside the footprint of the body of the packaged semiconductor device 1100. This arrangement can increase reliability and ease of inspection by making the extended portion 1105 of the leads 1103 visible when examined in a top down view of the system board, to enable human or machine vision inspection equipment to confirm that the leads are present in a top down view and to enable visual verification of the correct locations during and after mounting to a system board (not shown).

Figure 12:
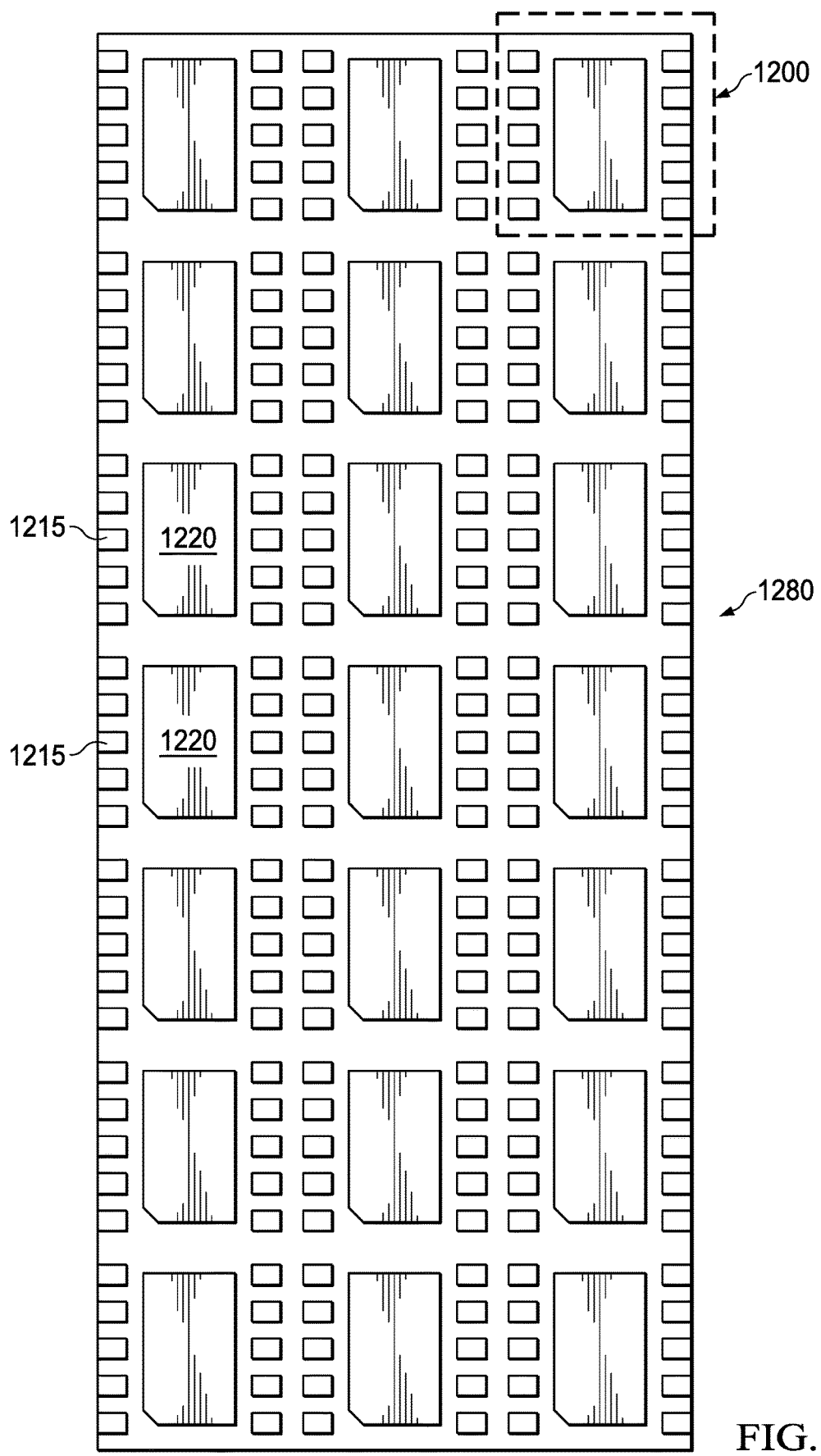
FIG. 12 illustrates in a plan view an array of packaged semiconductor devices in small outline no-lead (SON) packages.

In an example method arrangement, the packaged device carriers can be provided in array form and can be mounted to packaged semiconductor devices provided in a strip or array, the mounted packaged devices can then be cut apart in a singulation operation to form completed assemblies. FIG. 12 illustrates in a plan view an array 1280 of packaged semiconductor devices 1200 after molding operations. The terminals 1215 of the semiconductor devices are not covered by the package bodies for the packaged semiconductor devices and are exposed for mounting. Thermal pads 1220 are also shown exposed from the mold compound for each of the packaged devices.

Figure 13A:
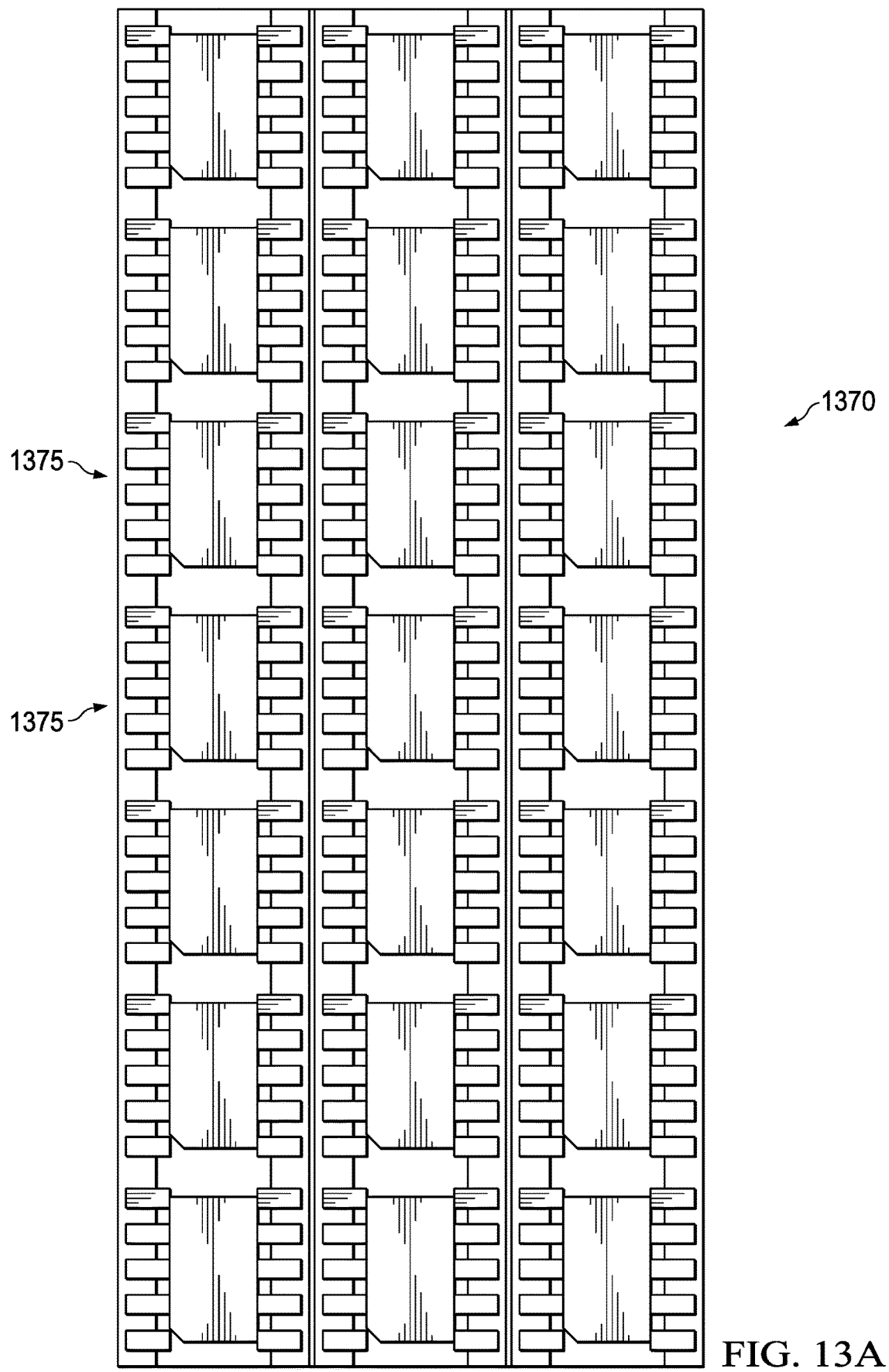
FIG. 13A illustrates a top view of an array of packaged device carriers.
Figure 13B:
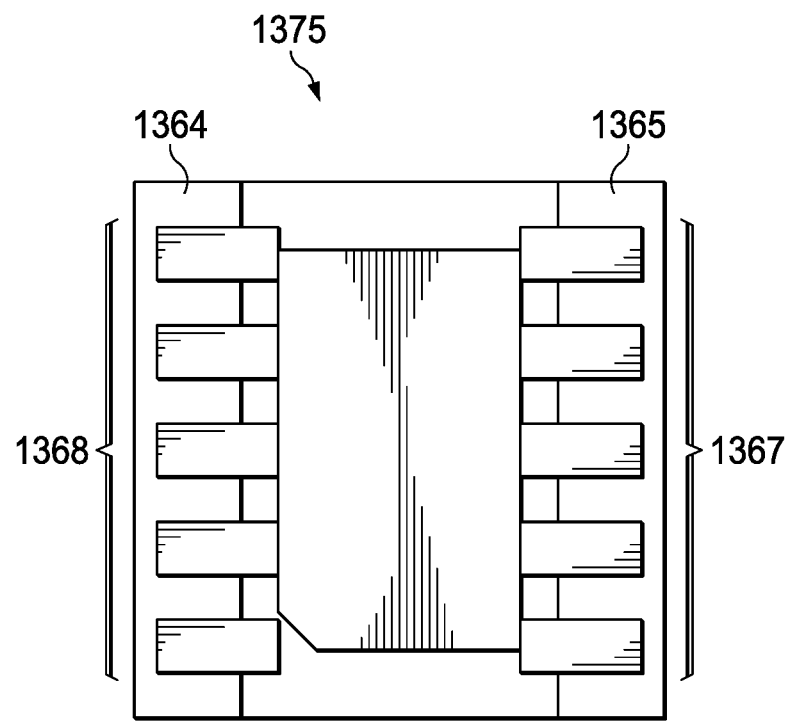
FIG. 13B illustrates in a top view a detailed view of one packaged device carrier of the array of FIG. 13A.

FIG. 13A illustrates in a plan view a strip format for a packaged device carrier array 1370 that has a plurality of packaged device carriers 1375 in a strip form mounted to an array of semiconductor devices such as shown in FIG. 12. FIG. 13B illustrates in a detail view a single packaged device carrier 1375 from the array 1370 in FIG. 13A. In FIG. 13B, the packaged device carrier includes a first dielectric portion 1364 carrying a first row of leads 1368 and a second dielectric portion 1365 and a second row of leads 1367, the leads having portions arranged to couple to the terminals of the packaged semiconductor devices.

FIG. 10A, described hereinabove, is a cross sectional view of an assembled packaged semiconductor device mounted to the packaged device carrier, a single packaged semiconductor device corresponding to the top view in FIG. 13B.

FIGS. 14A-C illustrate in cross sectional views alternative arrangements for mounting packaged semiconductor devices to packaged device carriers. In FIG. 14A, a "chip-on-leads" packaged device 1400 is shown mounted to a packaged device carrier 1460 to form a mounted packaged device 1475. In a "chip on lead" device a semiconductor die is supported by and mounted to leads on the internal package lead frame (not shown) in the package, for example a flip chip arrangement may be used. The resulting packaged semiconductor device 1400 has no thermal pad, as shown in FIG. 14A. The semiconductor device carrier 1460 has two sleeve portions with a first dielectric carrier supporting a row of leads 1467 at one end of the packaged device 1400 and a second dielectric carrier supporting a second row of leads 1468 at an opposing end of the packaged semiconductor device 1400. The packaged semiconductor device is mounted to a board side surface of the two dielectric sleeves and the leads such as 1467, 1468 have exposed lands corresponding to the terminals 1415 of the leads 1410 of the packaged semiconductor device, so that when the packaged semiconductor device is mounted to the packaged device carrier 1460, the packaged semiconductor device 1400 is beneath the dielectric sleeves (as oriented in FIGS. 14A-14C). The leads in FIGS. 14A-14C are C-shaped and are semicircular in cross section, so that the exposed end portions of leads 1467, 1468 (bottom ends as oriented in FIGS. 14A-14C) form planar portions for surface mounting on a system board (not shown) using solder, for example. In FIG. 14B, the packaged semiconductor device carrier 1460 is shown with a small outline no lead (SON) package or quad flat no lead (QFN) package device 1400 mounted on the board side surface of the two dielectric sleeves, in this example a thermal pad 1450 of the packaged device carrier faces away from a system board (not shown) and is exposed at the upper portion of the assembly 1475 (as oriented in FIG. 14B) for efficient thermal transfer due to the exposed pad. Additional methods for heat dissipation, such as flowing forced air over the assembly or applying an additional heat slug to the thermal pad 1450 can be used.

FIG. 14C illustrates in another cross sectional view a packaged device carrier 1460 with a packaged semiconductor device 1400 mounted to a board side surface of the packaged device carrier 1460, the packaged device carrier including an integral thermal pad 1455 to further increase thermal dissipation from the packaged deice 1400. The thermal pad 1455 is thermally conductive and is in contact with the thermal pad 1450 of the packaged semiconductor device 1400, and may be affixed to the thermal pad 1450 using a thermally conductive adhesive (not shown for clarity). Terminals 1415 of the packaged semiconductor device, which are exposed portions of leads 1410, are used to mount the packaged semiconductor device to the leads 1467, 1468.

Figure 15A:
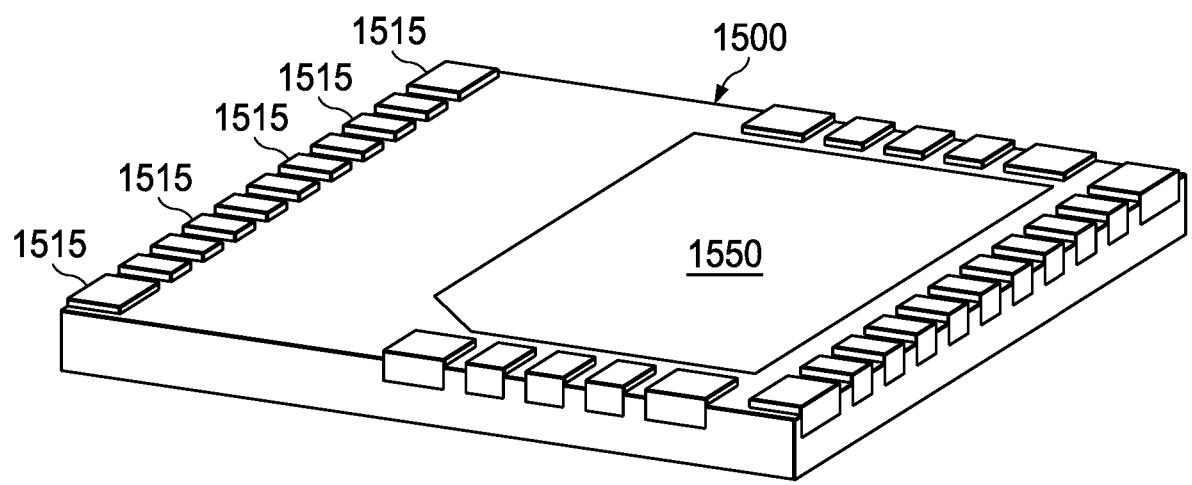
FIG. 15A illustrates in a projection view a quad flat no-lead (QFN) packaged semiconductor device.

FIG. 15A illustrates in a projection view a packaged semiconductor device 1500 in a QFN package that can be used with an arrangement. In an example the packaged semiconductor device 1500 is a power field effect transistor (FET) device such as a NexFET™ Gallium Nitride (GaN) device available from Texas Instruments Incorporated. In the device 1500, the thermal pad 1550 is used as a terminal (source or drain terminal) as well as a thermal pad because the NexFET™ device is a vertical FET, with the body of the semiconductor substrate forming the source terminals of a FET transistor. The remaining terminals 1515 include drain, control, sensor and gate terminals for the device. In an example multiple terminals 1515 can be coupled to the gate, drain and source of the NexFET™ device.

Figure 15B:
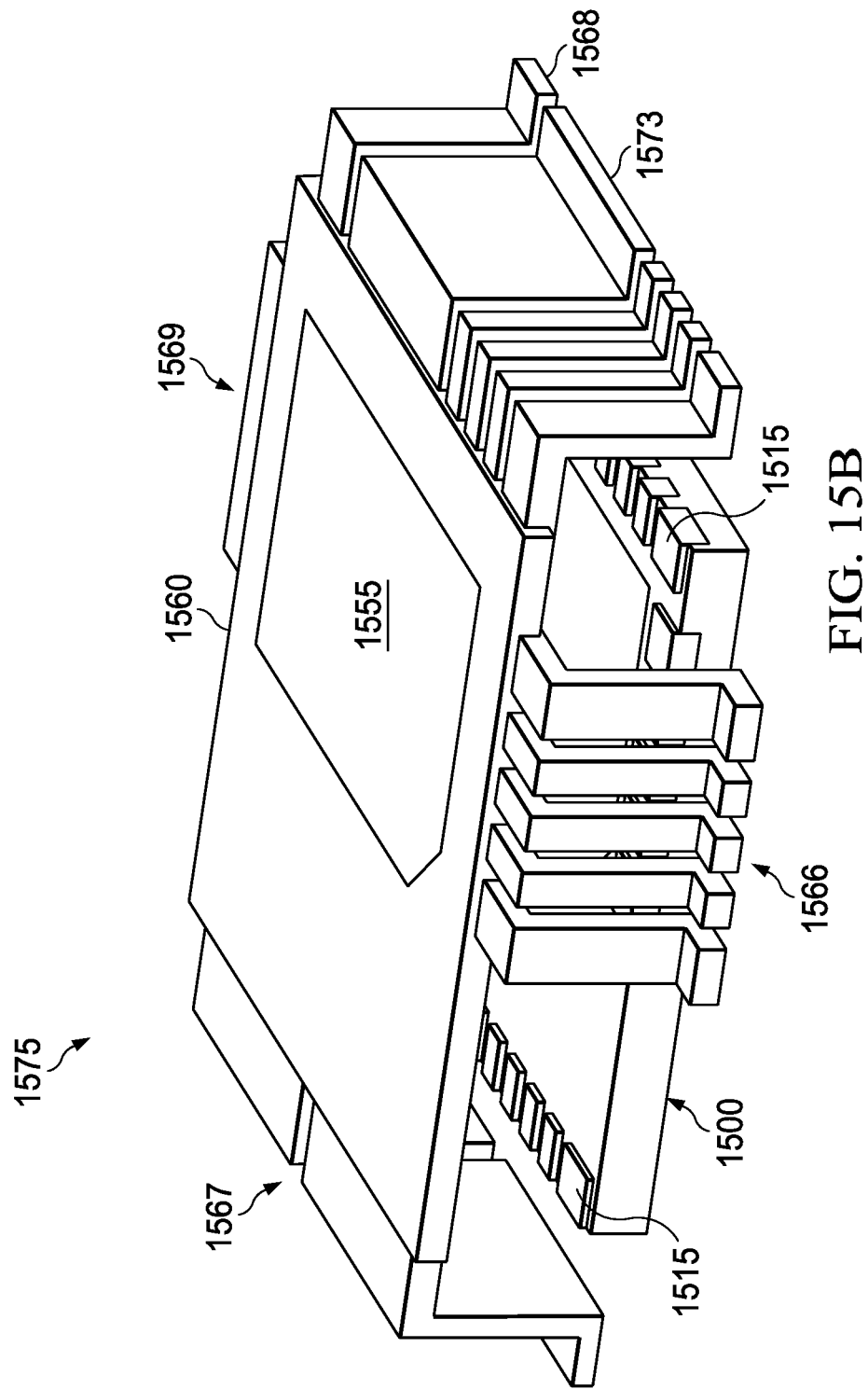
FIG. 15B illustrates the QFN packaged semiconductor device aligned with a packaged device carrier.

FIG. 15B illustrates an arrangement 1575 including a packaged device carrier 1560 with a packaged device 1500 arranged to be attached to the board side surface (bottom surface as oriented in FIG. 15B) of the packaged device carrier 1560. The packaged device carrier 1560 has four rows of leads (1567, 1568, 1566, 1569) with exposed ends (not visible in FIG. 15B) corresponding to the exposed terminals 1515 of packaged device 1500. Some of the leads of the packaged device carrier have varying widths, and some of the leads of the packaged device carrier are combined in wider leads such as 1573. In applications where multiple terminals of the packaged device are to be electrically coupled together, providing the wider combined leads on the packaged device carrier, see for example lead 1573, results in higher performance for the device when mounted to a system board. Resistance is reduced over smaller individual leads and inductance characteristics and noise performance can be improved. In alternative arrangements, the leads of the packaged device carrier 1560 can have a common or uniform width. The package device carrier 1560 includes a thermal pad 1555 that extends through the dielectric body of the packaged device carrier 1560 and provides a thermal transfer path.

Figure 15C:
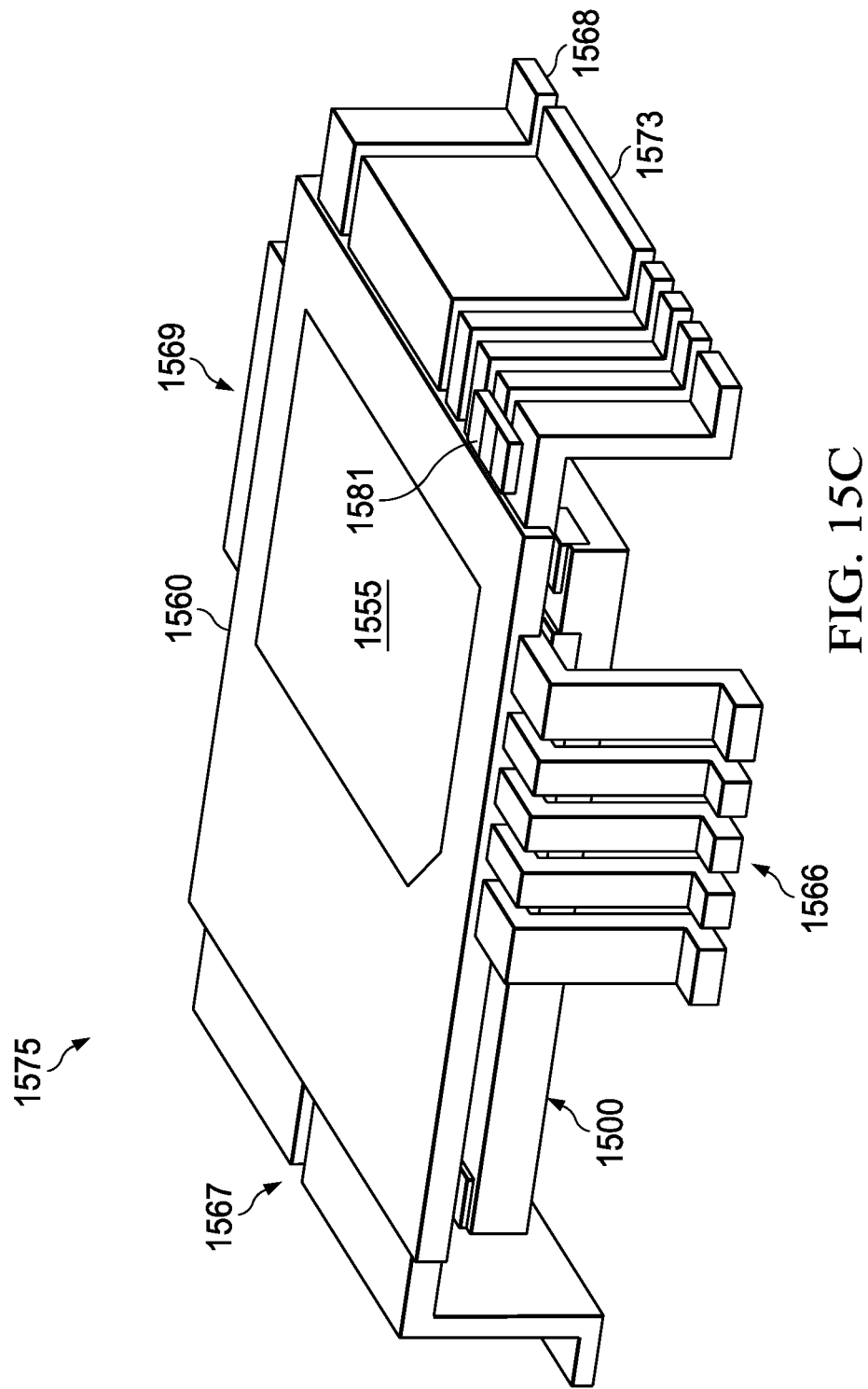

FIG. 15C illustrates the packaged device carrier 1560 and the packaged device 1500 (shown in FIG. 15B) after the packaged device is mounted to the packaged device carrier to form an assembly 1575. The packaged device 1500 can be mounted to the packaged device carrier 1560 using solder on the terminals in a solder reflow process, using conductive epoxy, or by other methods for assembly used for assembling components to boards and substrates. The illustration in FIG. 15C also includes a passive component 1581 which in this example is a bypass capacitor. Capacitors, resistors, inductors, sensors and other passive components can be mounted to the passive device carrier 1560 to further improve performance of the assembly 1575 and to reduce the system board area required by the assembly 1575 by providing additional places to mount the components away from the system board (not shown in FIG. 15C, see FIG. 15D) the assembly 1575 will be mounted to.

Figure 15D:
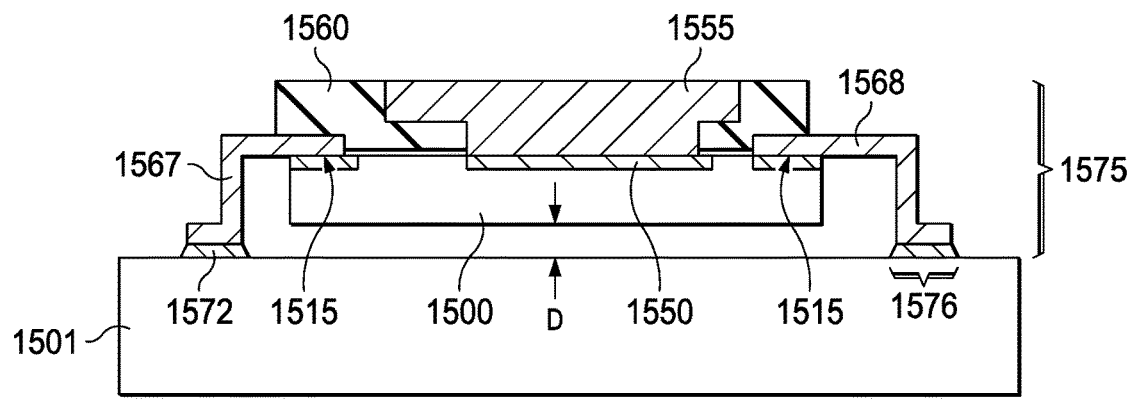
FIG. 15D illustrates the packaged semiconductor device mounted to the packaged device carrier in a cross-sectional view.

FIG. 15D is a cross sectional view of the assembly 1575 (see FIG. 15C) including the packaged device carrier 1560 mounted to a system board 1501. As shown in FIG. 15D, the leads 1567 and 1568 extend form the packaged device carrier 1560 and end in a foot portion 1576 that is arranged parallel to the upper surface (as oriented in FIG. 15D) of device carrier 1560; the leads 1567 and 1568 are attached to board 1501 using solder 1572. The middle portions of the leads 1567, 1568 form mechanical support for the assembly 1575 and also provide a spacing D between the packaged semiconductor device 1500 and the board 1501, so that the two are thermally isolated from one another. Thermal energy produced by device 1500 at thermal pad 1520 of the packaged device is coupled to the thermal pad 1550 on device carrier 1560 and conducted away from the system board 1501.

Figure 16A:
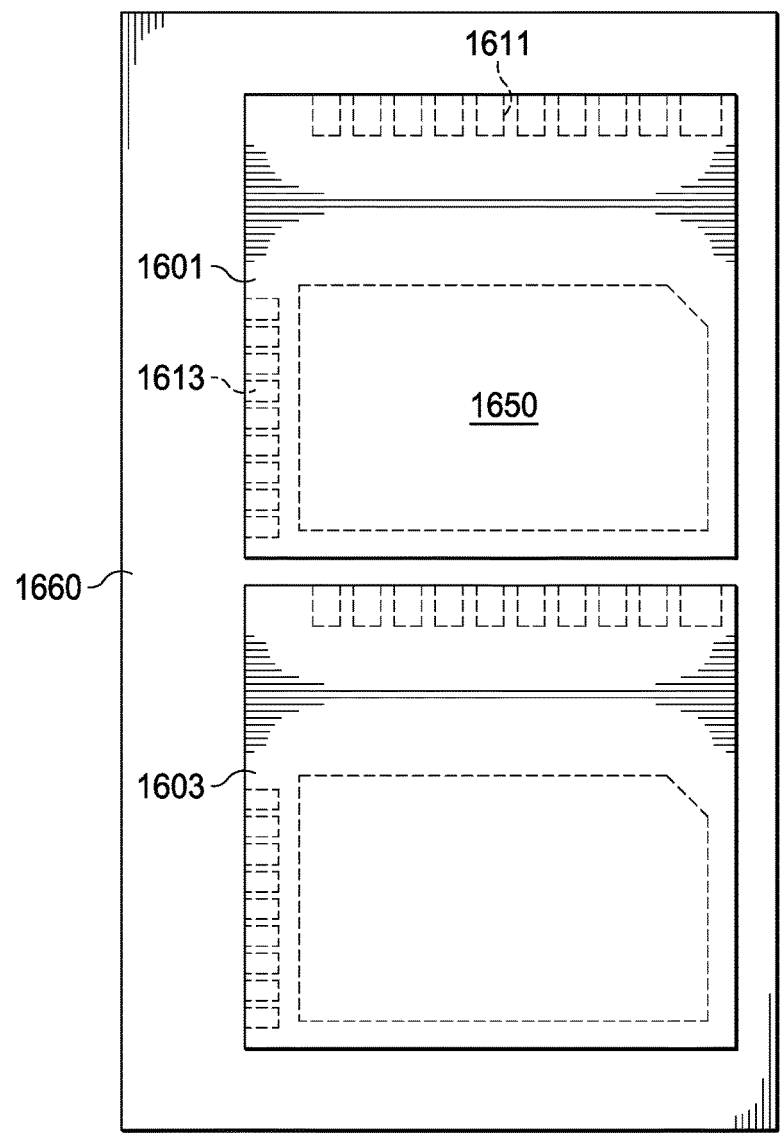
FIGS. 16A-16D illustrates a plan view, a top view, a side view and a front view of a packaged device carrier having two packaged semiconductor devices mounted to the packaged device carrier and coupled together to form a multi-chip module.
Figure 16B:
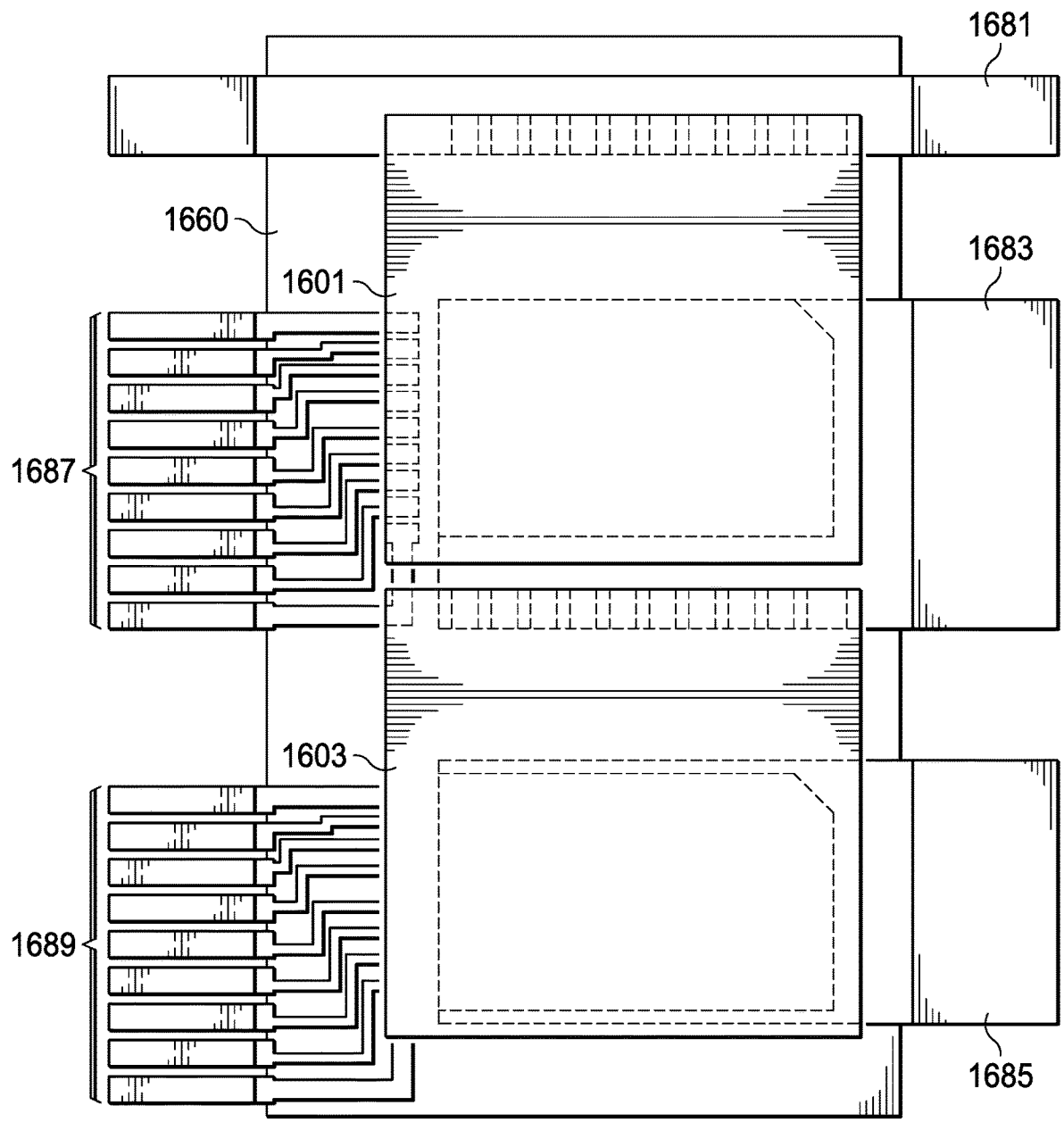
Figure 16C:
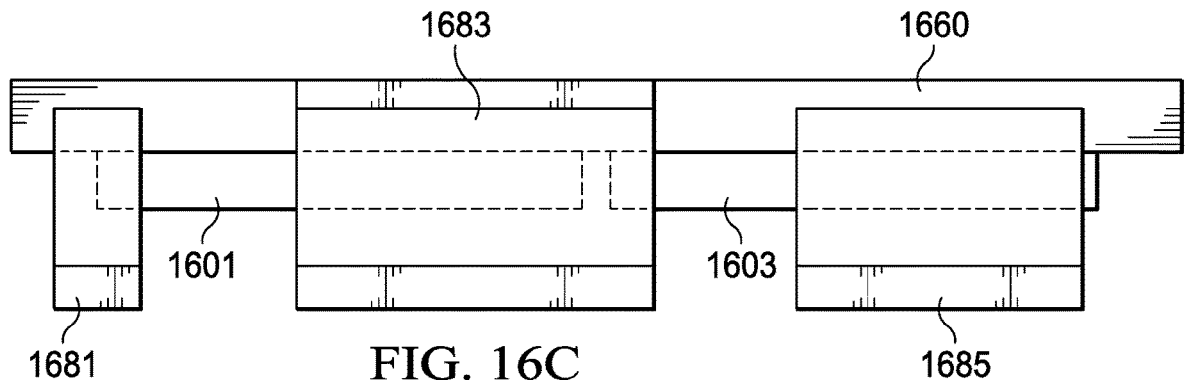

FIGS. 16A-C illustrate in a series of views an advantageous arrangement using the packaged device carriers. In FIG. 16A, a multi-chip module is formed using two FET devices in QFN packages 1601, 1603. In many circuit topologies power FET devices are arranged in a "half-bridge" with a high side FET device having a drain to source path coupled between a voltage supply and a switching node, and a low side FET device coupled between the switching node and a ground terminal. Additional components can be coupled between the switching node and an output terminal to supply a voltage to a load. Switching power converters such as step down or buck converters, step up or boost converters, and other functions can be realized using the half bridge configuration. In addition to the power FETs, gate driver devices are used to supply independent gate signals to the power FETs, and controllers that sense the output voltage, load current, and temperatures can be used to regulate the voltage at the switching node or at the output. Many applications use a step down voltage converter to create a lower voltage, such as 5 Volts, from a DC voltage such as 12 Volts, however step up converters and other functions also use a pair of FET devices coupled to a supply voltage and to a switching node.

In FIG. 16A, in a top view, two packaged semiconductor FET devices 1601 and 1603 are arranged on a packaged device carrier 1660. By using common leads on the packaged device carrier to couple the packaged semiconductor devices together and to provide connection to the system board for both devices, increased integration is accomplished, while simultaneously minimizing the system board area needed to provide the function. In FIG. 16A, each of the devices can be a power FET such as a NexFET™ device from Texas Instruments Incorporated. In FIG. 16A, the devices 1601 and 1603 each have drain terminals 1611 arranged on one side, gate and control terminals 1613 arranged on another side, and a source terminal 1650 arranged as a thermal pad. The packaged devices each include a power FET with a source, gate and drain terminal as well as other control signals and outputs. In a half-bridge configuration the source terminal of device 1601 is connected to a switch node, as is the drain terminal of device 1603, the devices acting as a high side and low side transistor in the half-bridge. In the arrangements these connections can be made on the packaged device carrier as is further described hereinbelow.

Figure 16D:
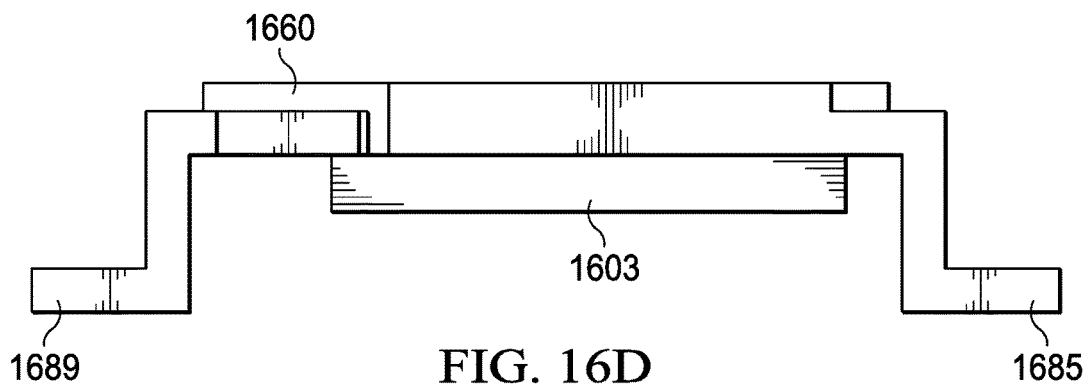

In FIG. 16B the packaged device carrier 1660 is shown in a plan view looking at the board side surface. Devices 1601 and 1603 are shown in partial outline in this top down view so the connections to the terminals are visible. Lead 1681 couples the drain terminals (see FIG. 16A) of device 1601 together and provides an external connection. In an example application, the lead 1681 can be coupled to a voltage supply to provide the high side voltage at the drain of the device 1601. Lead 1683 is coupled to the source terminal and pad on the device 1601 and to the drain terminals of device 1603 to provide the switch node external connection. Lead 1685 of the packaged device carrier provides the external connection to the source of device 1603 and is coupled to the source and thermal pad of device 1603, this terminal can be coupled to a ground or low voltage supply in an application for a half bridge. In addition a group of leads 1689 provide connections for gate signals, clock signals, and other input/output signals for the device 1603. Leads 1687 provide similar connections to device 1601. FIGS. 16C and 16D illustrate a side view and a front view of the packaged device carrier 1660 and the leads shown in FIG. 16B. FIG. 16B further illustrates an example of signal redistribution in area 1693, where signals are routed apart for greater spacing. Signal redistribution can be done to improve system board routing or efficiency, or to reduce the area needed to mount the packaged device carrier to a system board (when compared to mounting the packaged semiconductor devices directly to a system board).

Figure 17:
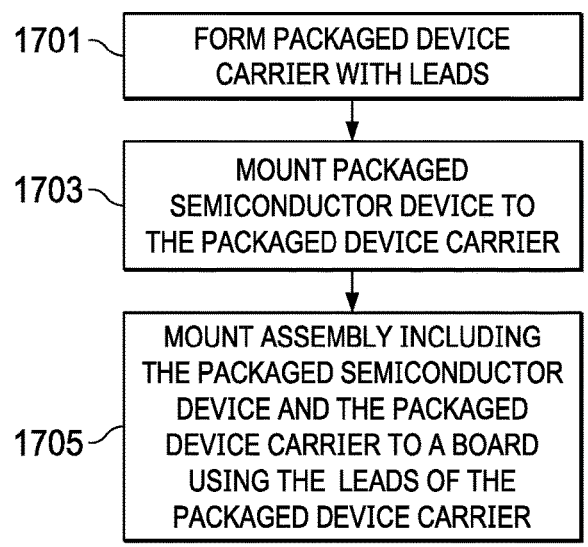
FIG. 17 illustrates in a flow diagram a method for using an arrangement.

FIG. 17 illustrates in a flow diagram a method arrangement. In step 1701, the packaged device carrier is formed (see FIGS. 7A-7E, FIG. 8A-8B) with conductive leads extending from a dielectric portion, at step 1703 a packaged semiconductor device is mounted to the packaged device carrier (see FIG. 10A) and in step 1705, the packaged device carrier can be mounted to a system board or substrate, (see FIG. 15D). Use of the arrangements increases board level reliability by providing thermal isolation between packaged semiconductor devices and circuit boards, by providing mechanical flexibility in the conductive leads to allow motion to accommodate thermal or mechanical stress without joint failures, and to enable visual inspection of solder joints that would be hidden by alternative surface mounts for packaged semiconductor devices. Additional advantages include the possibility of placing multiple components including passive components on the packaged device carrier, reducing system board space requirements, and redistribution of signal routes to improve board level routing efficiency.

Modifications are possible in the described arrangements, and other alternative arrangements are possible within the scope of the claims.

What is claimed is:

1. An apparatus, comprising:
    a packaged device carrier having a board side surface and an opposing surface, the packaged device carrier having conductive leads having a first thickness spaced from one another;
    the conductive leads having a head portion attached to a dielectric portion, a middle portion extending from the head portion and extending away from the board side surface of the packaged device carrier at an angle to the opposing surface, and each lead having an end extending from the middle portion with a foot portion configured for mounting to a substrate, wherein the dielectric portion of the packaged device carrier is a first dielectric portion and the packaged device carrier further comprises a second dielectric portion, the first and second dielectric portions spaced from one another, each of the first and second dielectric portions attached to a subset of the conductive leads, the conductive leads including conductive lands in the head portion exposed from the first and second dielectric portions.

2. The apparatus of claim 1, wherein the conductive lands are arranged in correspondence with terminals of a no-lead packaged semiconductor device.

3. The apparatus of claim 1, wherein the middle portion of the conductive leads extend away from the packaged device carrier in a straight direction and the ends of the conductive leads are angled to the middle portion and so form the foot portion.

4. The apparatus of claim 1, wherein the middle portion of the conductive leads extends from the packaged device carrier in a semicircular direction.

5. The apparatus of claim 1, wherein the conductive leads form an "S" shape.

6. The apparatus of claim 1, wherein the conductive leads form a "Z" shape.

7. The apparatus of claim 1, wherein the conductive leads are flexible.

8. The apparatus of claim 1, wherein the conductive leads have varying widths.

9. The apparatus of claim 1, wherein the conductive leads have uniform widths.

10. The apparatus of claim 1 wherein the dielectric portion of the packaged device carrier comprises a material that is one taken from a group consisting essentially of mold compound, epoxy, resin, epoxy resin, plastic, fiberglass, liquid crystal polymer, and Bismaleimide Triazine (BT) resin.

11. The apparatus of claim 1, the packaged device carrier further comprising a thermally conductive portion extending through the first dielectric portion and having a first exposed surface configured to contact a packaged semiconductor device thermal pad and having a second exposed surface opposite the first exposed surface, the second exposed surface configured for thermal transfer.

12. The apparatus of claim 1 wherein the conductive leads further comprise one selected from a group consisting essentially of copper and copper alloys.

13. An apparatus comprising:
    a packaged semiconductor device in a no-lead package having package terminals; and
    a packaged device carrier with the packaged semiconductor device mounted thereon, the packaged device carrier further comprising:
    a board side surface and an opposing surface, the packaged device carrier having conductive leads spaced from one another and extending from the board side surface;
    the conductive leads having a head portion attached to a dielectric portion, a middle portion extending from the head portion and extending away from the dielectric portion at an angle to the opposing surface, and each lead having an end extending from the middle portion with a foot portion configured for mounting to a substrate, wherein the packaged device carrier further comprises a thermal pad extending through the dielectric portion, the thermal pad of the packaged device carrier contacting a thermal pad of the packaged semiconductor device.

14. The apparatus of claim 13, wherein the packaged semiconductor device comprises a first packaged semiconductor device, and further comprising a second packaged semiconductor device mounted on the packaged device carrier.

15. The apparatus of claim 14, and further comprising a subset of the conductive leads coupled to terminals on both the first packaged semiconductor device and the second packaged semiconductor device.

16. The apparatus of claim 15, wherein the first and the second packaged semiconductor devices comprise FET devices.

17. The apparatus of claim 13, wherein the packaged semiconductor device is mounted to the board side surface of the packaged device carrier.

18. The apparatus of claim 13, wherein the packaged semiconductor device is mounted to the opposite surface of the package device carrier.

* * * * *